United States Patent
Uchida et al.

(10) Patent No.: US 8,410,805 B2
(45) Date of Patent: Apr. 2, 2013

(54) ELECTRIC FIELD DETECTION PROBE, METHOD THEREOF, AND MANUFACTURING METHOD OF CIRCUIT BOARD

(75) Inventors: Daisuke Uchida, Kawasaki (JP); Shinichi Wakana, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 540 days.

(21) Appl. No.: 12/712,956

(22) Filed: Feb. 25, 2010

(65) Prior Publication Data
US 2010/0219806 A1 Sep. 2, 2010

(30) Foreign Application Priority Data

Feb. 27, 2009 (JP) .................................. 2009-46663
Sep. 25, 2009 (JP) ................................ 2009-221342

(51) Int. Cl.
*G01R 31/302* (2006.01)
*G01R 1/067* (2006.01)

(52) U.S. Cl. .......... 324/754.27; 324/754.21; 324/755.01

(58) Field of Classification Search ............... 324/76.11, 324/437, 445, 446, 751.1, 754.01, 754.03, 324/754.07, 754.11, 754.21, 754.24, 754.26, 324/755.01, 690, 696, 715, 724, 149, 72.5
See application file for complete search history.

(56) References Cited

U.S. PATENT DOCUMENTS

| | | | |
|---|---|---|---|
| 5,274,336 A | 12/1993 | Crook | |
| 5,469,064 A | 11/1995 | Kerschner | |
| 5,900,618 A * | 5/1999 | Anlage et al. | 250/201.3 |

FOREIGN PATENT DOCUMENTS

| | | |
|---|---|---|
| JP | H5-264672 | 10/1993 |
| JP | 2000-214200 | 8/2000 |
| JP | 3240470 | 10/2001 |
| JP | 2004-205416 | 7/2004 |
| JP | 2007-278820 | 10/2007 |

\* cited by examiner

*Primary Examiner* — Hoai-An D Nguyen
(74) *Attorney, Agent, or Firm* — Fujitsu Patent Center

(57) ABSTRACT

An electric field detection probe includes a cable including an internal conductor line, an insulating layer that coats a surface of the internal conductor line and exposes a tip end of the internal conductor line, an external conductor layer that coats a surface of the insulating layer and exposes the tip end, and an electric field diaphragm wherein the electric field diaphragm is electrically coupled to the external conductor layer, covers the tip end surface of the cable except for an opening.

20 Claims, 33 Drawing Sheets

51 CONDUCTIVE MEMBER

51a RECESSED PORTION
51

51b OPENING
6 ELECTRIC FIELD DIAPHRAGM

51c OPPOSITE FACE

SMALL DIAMETER OPENING

INTERMIEDIATE DIAMETER OPENING

LARGE DIAMETER OPENING

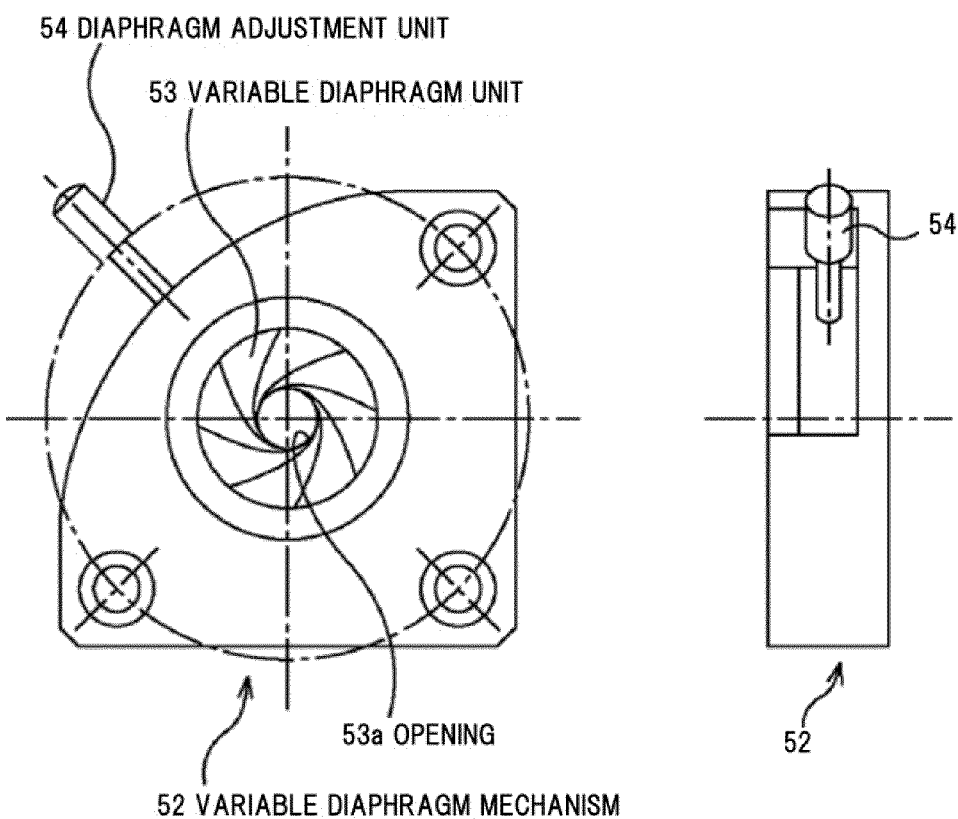

66 SILICON OXIDE FILM

333# ELECTRIC FIELD DETECTION PROBE, METHOD THEREOF, AND MANUFACTURING METHOD OF CIRCUIT BOARD

CROSS-REFERENCE TO RELATED APPLICATIONS

This application is based upon and claims the benefit of priority from the prior Japanese Patent Application No. 2009-221342 filed on Sep. 25, 2009, and the prior Japanese Patent Application No. 2009-046663 filed on Feb. 27, 2009, the entire contents of both priority applications are incorporated herein by reference.

FIELD

The present disclosure relates to an electric field detection probe that detects an electric field radiated from wirings over a circuit board.

BACKGROUND

Many electronic devices require multi-functions and high-speed processing. Signals and radiation noises generated over printed circuit boards are factors that substantially degenerate performance of such electronic devices. In particular, electronic devices such as mobile phones and notebook computers with wireless communication functions are directly influenced by a noise failure. Thus, detecting a source of a noise and preventing a noise at a designing stage have been desired. As a measure against a noise, a structural designing evaluation utilizing an electromagnetic field simulation has been performed. However, a technique for measuring an electric field distribution at a surface and the proximity of an actual circuit board has not been established yet, and accuracy of the simulation has not been verified yet.

A technique is well known in which an antenna a size of which is approximately a wavelength of an electric field is used to measure an electric field distribution away from a printed circuit board. A measure has been considered in which an inverse operation is applied to an electric field distribution near a printed circuit board using a measurement result and design data of the printed circuit board to be measured. However, it is difficult to estimate an electric field radiated from each of wirings formed over a printed circuit board using the above described methods to measure an electric field distribution and applying the method to verify simulation accuracy is difficult.

Japanese Laid-open Patent Publication No. 2000-214200 discloses a neighboring magnetic field probe or a neighboring magnetic field probe system capable of detecting magnetic field component of an electromagnetic field caused near a circuit board with high spatial resolution. According to the Japanese Laid-open Patent Publication No. 2000-214200, a method for measuring a radiating magnetic field is employed in which an inductive current caused by a magnetic flux that transmits through a coil unit at a tip of a probe is detected. An electric field noise is blocked by providing a coil unit and a shield electrode along a transmission line and a magnetic field is detected with high resolution by making an area of a coil opening small.

Japanese Laid-open Patent Publication No. 2007-278820 discloses an electric field probe and an electric field measurement system capable of measuring an electric field component with high sensitivity. According to the Japanese Laid-open Patent Publication No. 2007-278820, an electric field is detected with a high sensitivity by exposing a core of a coaxial cable such as a semi-rigid cable, and covering the exposed core with a material having a high dielectric constant.

Japanese Laid-open Patent Publication No. H05-264672 discloses an electric field probe that enhances a shielding effect. According to the Japanese Laid-open Patent Publication No. H05-264672, unnecessary electric field components are shielded by narrowing a width of a dielectric layer disposed between an external conductor and an internal conductor of a coaxial cable.

Japanese Laid-open Patent Publication No. 2004-205416 discloses an electric field probe in which a tip end surface of a coaxial cable is sloped and a surface including a surface of the tip end of the coaxial cable is covered with a probe casing that is made up of an insulating material, and a tip of the internal conductor of the coaxial cable is exposed from the tip of the tip surface.

The magnetic field probe disclosed in Japanese Laid-open Patent Publication No. 2000-214200 provides a structure essentially for detecting a magnetic field, and a coil unit needs to be short-circuited in order to detect an electric field. Detecting an electric field using the short-circuited coil unit has a drawback in that electric field components coming from all direction are detected simultaneously at a transmission line of the exposed coil. In recent printed circuit boards, not only a width but only an interval of wirings have been miniaturized, thus the method disclosed in the Japanese Laid-open Patent Publication No. 2000-214200 detects electromagnetic field radiated from other wirings near a wiring to be measured or the surrounding elements. Hence, locating a source of an electric field noise in detail is difficult.

The electric field probe disclosed in the Japanese Laid-open Patent Publication No. 2007-278820 detects electric field components of all directions because the core is exposed. Thus, locating a source of an electric field noise in detail is difficult.

The electric field probe disclosed in the Japanese Laid-open Patent Publication No. H. 5-264672 has a limitation to make the dielectric layer thinner and unnecessary electric fields coming from the oblique directions are always detected when a section type electric probe is used as long as the dielectric layer exists. Hence, improving a spatial resolution has its limitation and locating a source of an electric field noise in detail is difficult.

Mostly an electric field radiated vertically from a wiring would need to be detected in order to locate a source of a noise radiated from a wiring in detail, in other words, electric field components radiated in parallel to a wiring needs to be shielded by an external conductor. However, the technique disclosed in the Japanese Laid-open Patent Publication No. H. 5-264672 detects, although slightly, an electric field coming from oblique directions. Mostly, vertical electric field components need to be extracted in order to achieve high spatial resolution. A probe structure that provides high spatial resolution lowers detection sensitivity, and the spatial resolution is degenerated when detection sensitivity is improved. Thus, switching probes are required for scanning a front surface of an object to be measured to identify a source of a noise, thus there is a drawback in that a measurement takes a long time. Sensitivity needs to be improved, for example, by filtering unnecessary frequencies when a frequency of a noise to be measured is known.

The electric field probe disclosed in the Japanese Laid-open Patent Publication No. 2004-205416 has a configuration in which the tip of the internal conductor of the coaxial cable is exposed from the surface. Therefore, as in the technique disclosed in Japanese Laid-open Patent Publication No.

2007-278820, electric filed components from all directions are detected and locating a source of a noise in detail is difficult.

SUMMARY

According to aspects of embodiments, an electric field detection probe includes a cable including an internal conductor line, an insulating layer that coats a surface of the internal conductor line and exposes a tip end of the internal conductor line, an external conductor layer that coats a surface of the insulating layer and exposes the tip end, and an electric field diaphragm wherein the electric field diaphragm is electrically coupled to the external conductor layer, covers the tip end surface of the cable except for an opening.

It is to be understood that both the foregoing summary description and the following detailed description are exemplary and explanatory and are not restrictive of the invention, as claimed.

BRIEF DESCRIPTION OF DRAWINGS

FIGS. 12A to 12B are schematic views depicting a configuration of a variable diaphragm mechanism of an electric field detection probe according to the fifth example of the first embodiment;

DESCRIPTION OF EMBODIMENTS

First Embodiment

A first embodiment presents an electric field detection probe that detects vertically-radiated electric fields among electric fields radiated from the wirings over a substrate with a relatively simple configuration and high resolution.

Figure 1A:
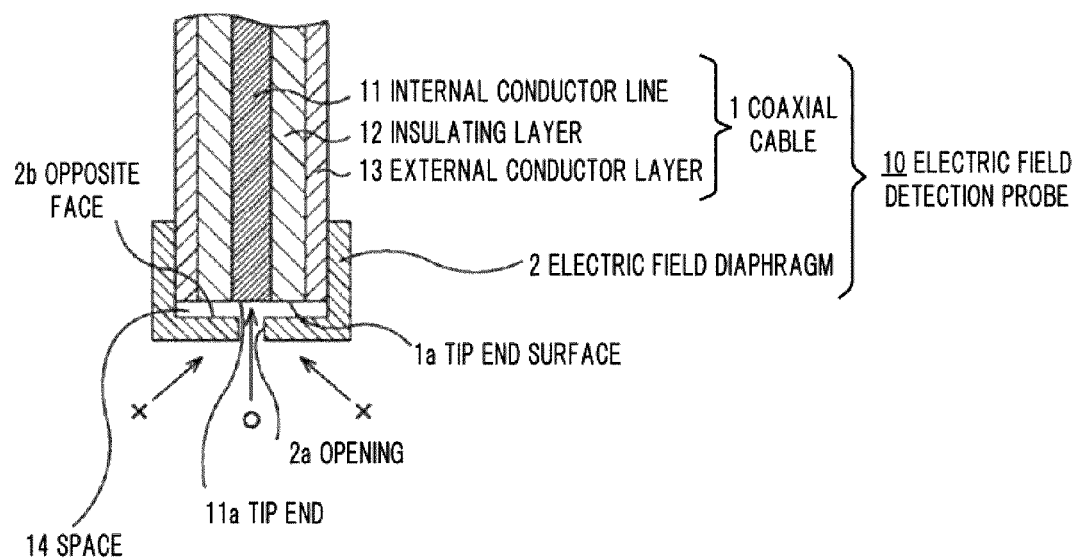
FIGS. 1A and 1B are schematic views depicting a configuration of an electric field detection probe according to a first embodiment.
Figure 1B:
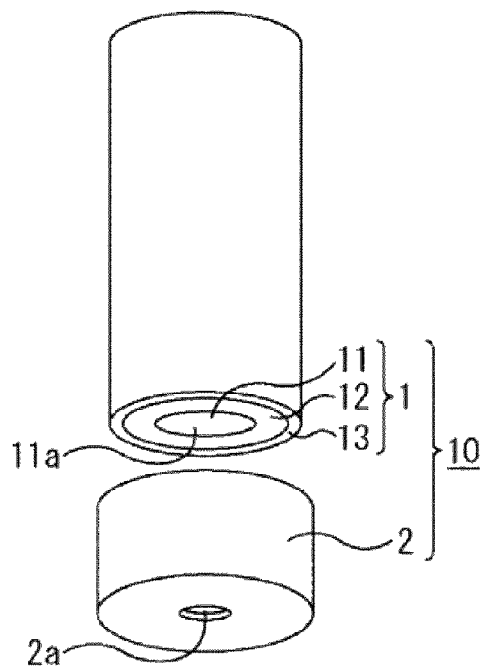

FIGS. 1A to 1B illustrate a schematic configuration of an electric field detection probe according to the first embodiment.

As illustrated in FIGS. 1A and 1B, an electric field detection probe 10 may include a coaxial cable 1 and an electric field diaphragm 2 disposed at a tip end of the coaxial cable 1.

The coaxial cable 1 exposes a tip end 11a of an internal conductor line 11 and may include an insulating layer 12 that coats a surface of the internal conductor line 11, and an external conductor layer 13 that coats the insulating layer 12.

The electric field diaphragm 2 is provided with an opening 2a with a given diameter formed through a surface of the electric field diaphragm 2. The electric field diaphragm 2 is electrically coupled with the external conductor layer 13 of the coaxial cable 1, covers the tip end surface 1a of the coaxial cable 1, a position of the opening 2a is aligned with the tip end 11a and mounted to the coaxial cable 1 so that the tip end 11a and the opening 2a face each other.

As illustrated in FIG. 1A, the tip end 11a of the internal conductor line 11 is spaced apart from a opposite face 2b that faces the tip end surface 1a of the electric field diaphragm 2. A dielectric layer may be appropriately inserted in a space 14 generated in the space. In FIG. 1B, a shape of the plane that includes the opening 2a is circular so as to fit the diaphragm 2 to the coaxial cable 1, however other shapes such as rectangular, and polygonal shape may be applied.

Among the electric field diaphragm 2, at least the portion that faces the tip end surface 1a of the coaxial cable 1 that includes the tip end 11a is made up of a conductive member. Thus, as illustrated in FIG. 1A, using the electric field detection probe 10 for detecting electric fields radiated from wirings blocks noise electromagnetic fields (indicated by an arrow with X) radiated from the adjacent wirings of the wiring to be measured as much as possible. As a result, mostly electric fields vertically radiated from the wiring to be measured (indicated by an arrow with a circle) are detected from the tip end 11a of the internal conductor line 11 through the opening 2a. As described above, the electric field detection probe 10 may extract and detect electric fields radiated from the wiring to be measured highly accurately and locate a source of a noise with high spatial resolution.

As the coaxial cable 1, a commercially available general-purpose cable may be used. The coaxial cable may be easily replaced by employing a method in which the electric field diaphragm 2 is mounted over the coaxial cable. A diameter of the opening 2a is preferably about 100 nm to 500 μm. A shape of the opening 2a may be a slit pattern with the opening enlarged in a scanning direction of a wiring instead of a circular pattern of the coaxial type. In this case, sensitivity of electric field detection may be improved without deteriorating spatial resolution, thus electric field noise detection with high spatial resolution and high sensitivity may be achieved.

Examples of the First Embodiment

A First Example of the First Embodiment

FIGS. 2A to 2H are schematic sectional views depicting a manufacturing method of the electric field detection probe according to a first example of the first embodiment in order of the processes.

Figure 2A:
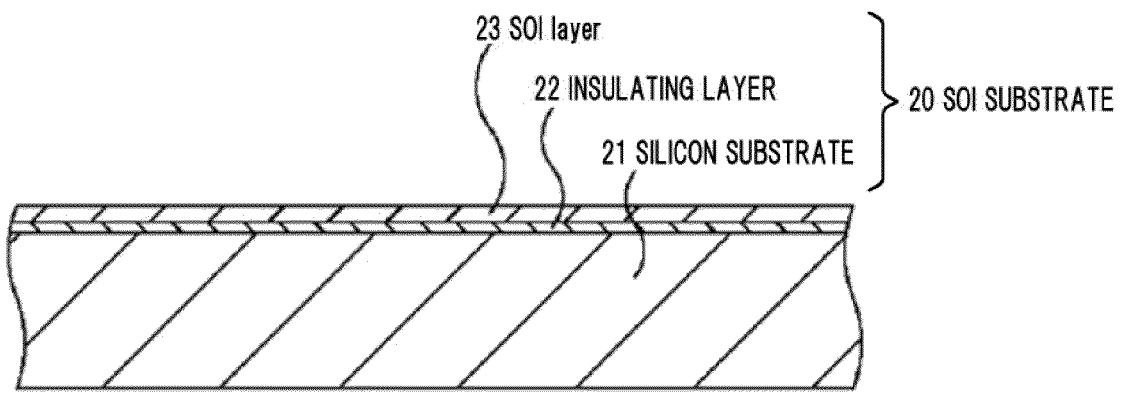
FIGS. 2A to 2H are schematic sectional views depicting a manufacturing method of the electric field detection probe according to a first example of the first embodiment in order of the processes.
Figure 2B:
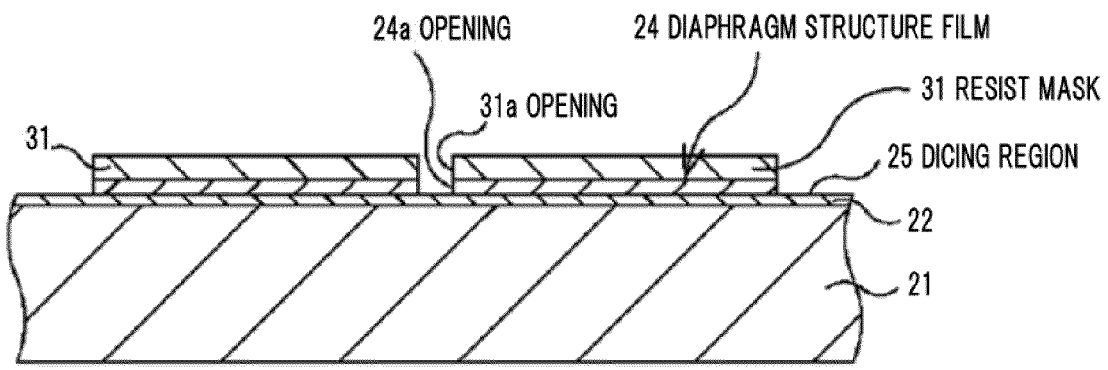

As illustrated in FIG. 2B, an SOI layer 23 of an SOI (Silicon(Semiconductor) On Insulator) substrate 20 in FIG. 2A is processed.

For example, an SOI substrate 20 that includes an SOI layer 23 is prepared over a silicon substrate 21 through an insulating layer 22. A resist is applied over the SOI layer 23 of the SOI substrate 20 and the resist is processed by lithography to form a plurality of resist masks 31, for example, the external shape of each of which is rectangular and with a circular opening 31 in the center part for each chip. The SOI layer 23 is dry-etched using the resist mask 31. A diaphragm structure film 24 the outer shape is rectangular and with a through-hole circular opening 24a in the center part is formed over the insulating layer 22 along the shape of the resist mask 31. The opening 24a is formed with a given diameter of 1 mm or less, in this case, approximately 50 μm to 100 μm. A region between adjacent diaphragm structure films 24 is a dicing region 25 for cutting each chip. The resist mask 31 is removed, for example, by ashing.

Figure 2C:
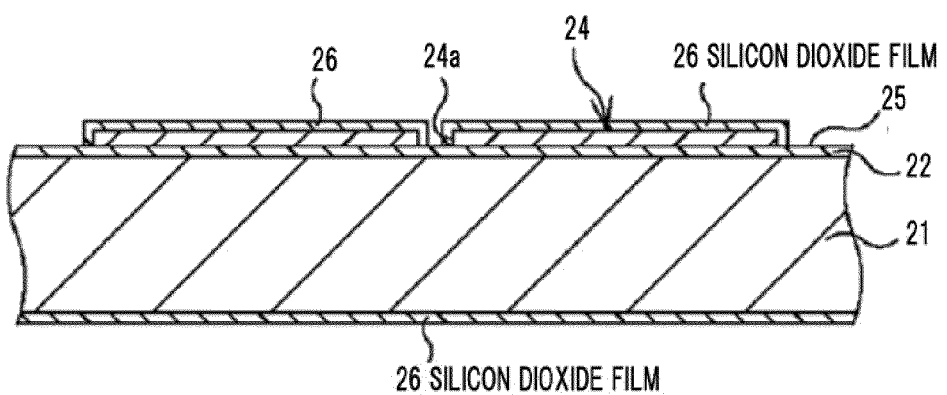

As illustrated in FIG. 2C, a silicon dioxide film 26 is formed.

For example, a whole surface including a back surface of the SOI substrate 20, in other words, a surface of the diaphragm structure film 24 and a back surface of the silicon substrate 21 are thermally-oxidized. A thin silicon oxide film 26 is formed over the surface of the diaphragm structure film 24 and the back surface of the silicon substrate 21. An insulating film such as a silicon oxide film or a silicon nitride film with a given film thickness may be formed over the back surface of the silicon substrate 21, for example, by a Chemical Vapor Deposition (CVD) method instead of forming the silicon oxide film 26 by thermal oxidation.

Figure 2D:
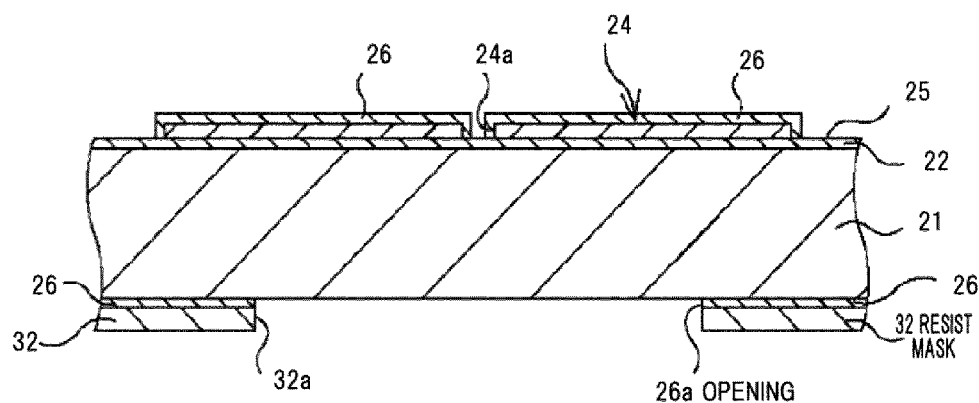

As illustrated in FIG. 2D, the silicon oxide film 26 over the back surface of the silicon substrate 21 is processed.

For example, a resist is applied over the silicon oxide film 26 that is disposed over the back surface of the silicon substrate 21. The resist is processed by lithography to form a resist mask 32 that includes an opening 32a, for example, with approximately 2.8 mm diameter of a rectangular shape that is larger than a diameter of a coaxial cable, which will be described later.

The silicon oxide film 26 that is disposed over a back surface of the silicon substrate 21 is wet-etched using the resist mask 32, for example, by hydrogen fluoride (HF) solution. An opening 26a along the opening 32a of the resist mask 32 is formed over the silicon oxide film 26.

Figure 2E:
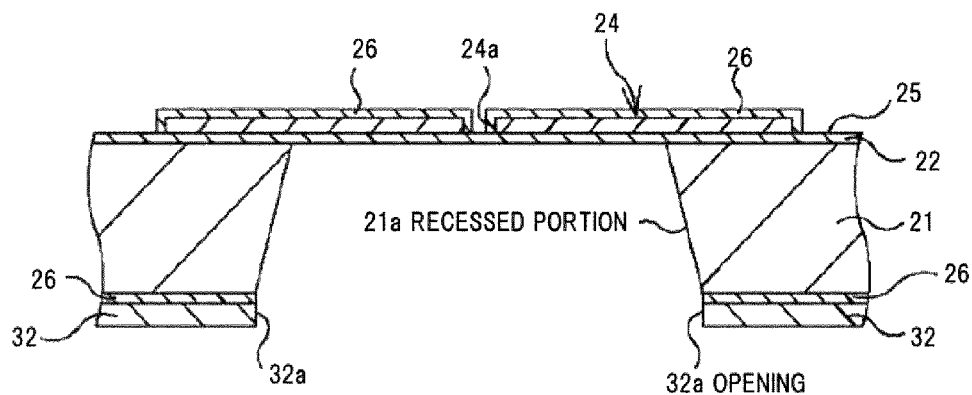

As illustrated in FIG. 2E, a recessed portion 21a is formed over the back surface of the silicon substrate 21.

For example, the back surface of the silicon substrate 21 is wet-etched, for example, by aqueous alkaline solution (tetramethylammonium hydroxide (TMAH)) using the silicon oxide film 26 (and the resist mask 32) as a mask, until the back surface of the silicon oxide film 26 over the surface of the silicon substrate 21 is exposed. The recessed portion 21a is formed over the back surface of the silicon substrate 21 along the opening 26a of the silicon oxide film 26. The recessed portion 21a may be formed with a size which allows insertion of a coaxial cable 1 with a diameter of approximately 2 mm.

Figure 2F:
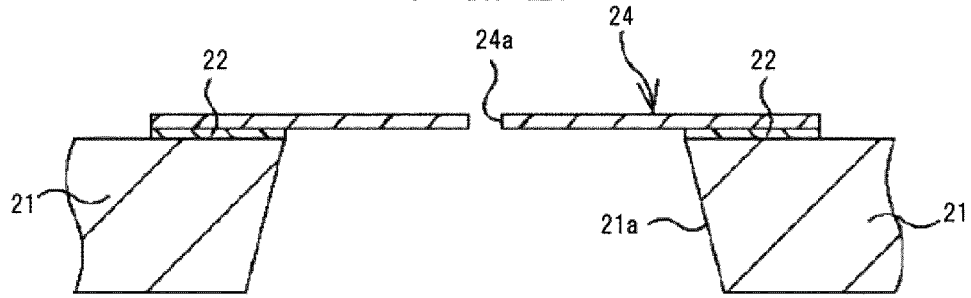

As illustrated in FIG. 2F, the silicon oxide film 26 is removed by wet etching, for example, using hydrofluoric acid (HF) solution. At this time, the resist mask 32 is expected to be removed together with the silicon oxide film 26; however, the resist mask 32 is removed by ashing if any resist mask 32 remains.

Figure 2G:
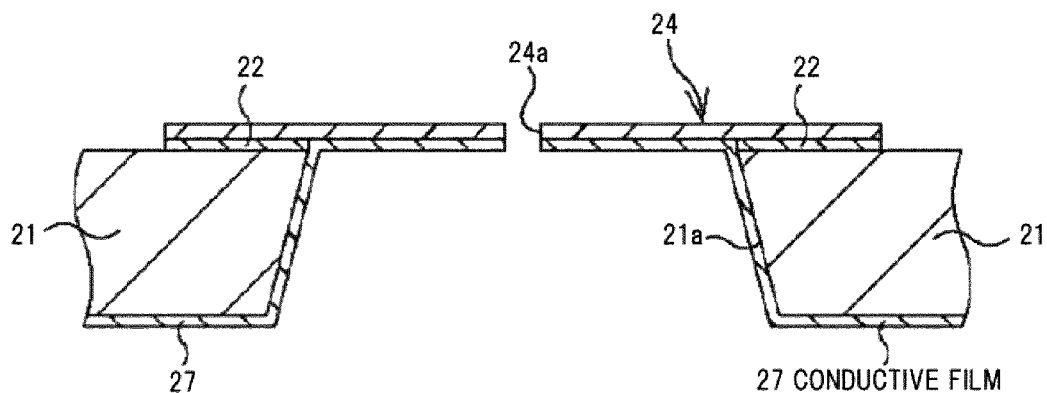

As illustrated in FIG. 2G, a conductive film 27 is formed over the back surface of the SOI substrate 20.

For example, titan (Ti) with a film thickness of approximately 20 nm is formed by sputtering, and gold (Au) or copper (Cu) with a film thickness of approximately 300 nm are formed, for example, by a vacuum deposition method. A conductive film 27 is formed over the back surface of the silicon substrate 21 that includes an inner wall surface of the recessed portion 21a.

Figure 2H:
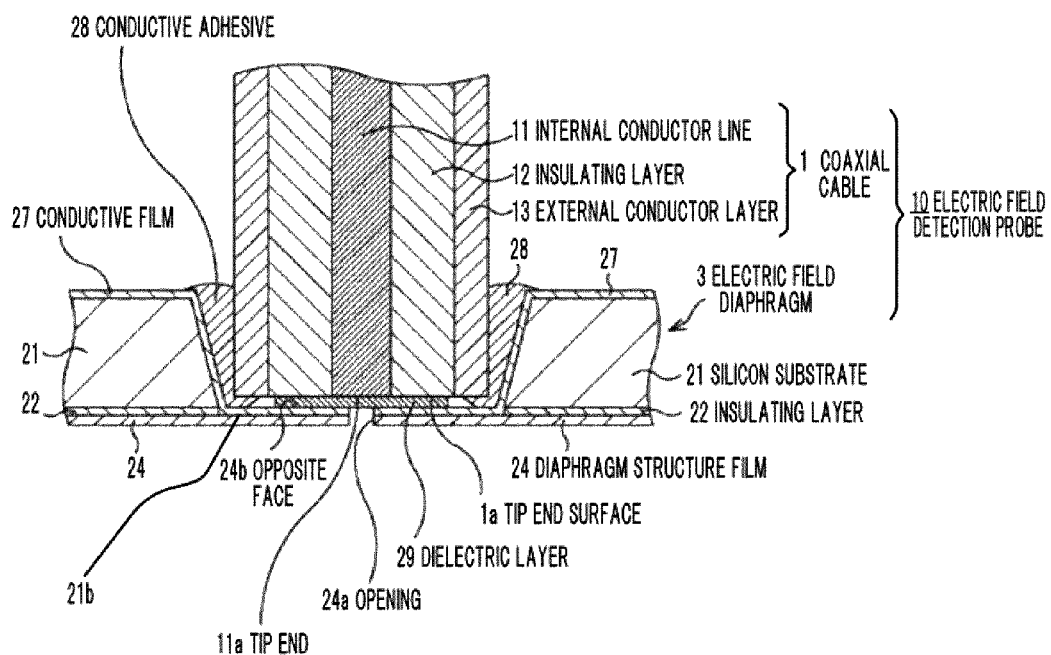

As illustrated in FIG. 2H, the electric field detection probe 10 according to the first example is formed.

For example, an electric field diaphragm 3 is obtained by cutting each chip along a dicing region 25 of the SOI substrate 20. A dielectric layer 29 is formed over the conductive film 27 over a bottom surface 21b of the recessed portion 21a of the electric field diaphragm 3. A dielectric material such as polyimide or Teflon (registered trademark of DuPont) is used for the dielectric layer 29. A tip end surface 1a of the coaxial cable 1 that is substantially the same as the coaxial cable illustrated in FIG. 1A is inserted into the recessed portion 21a of the electric field diaphragm 3 so that the tip end 11a of the internal conductor line 11 is aligned with the opening 24a through the dielectric layer 29. A space between sides of the coaxial cable 1 and sides of the recessed portion 21a of the electric field diaphragm 3 is filled with a conductive adhesive 28 such as Ag paste. The conductive adhesive 28 fixes the coaxial cable 1 in the recessed portion 21a of the electric field diaphragm 3 and electrically couples the external conductor layer 13 of the coaxial cable 1 and the conductive film 27.

As described above, the electric field detection probe 10 with the electric field diaphragm 3 is formed.

Hereunder, an electric field detection method using the above-configured electric field detection probe 10 will be described.

Figure 3:
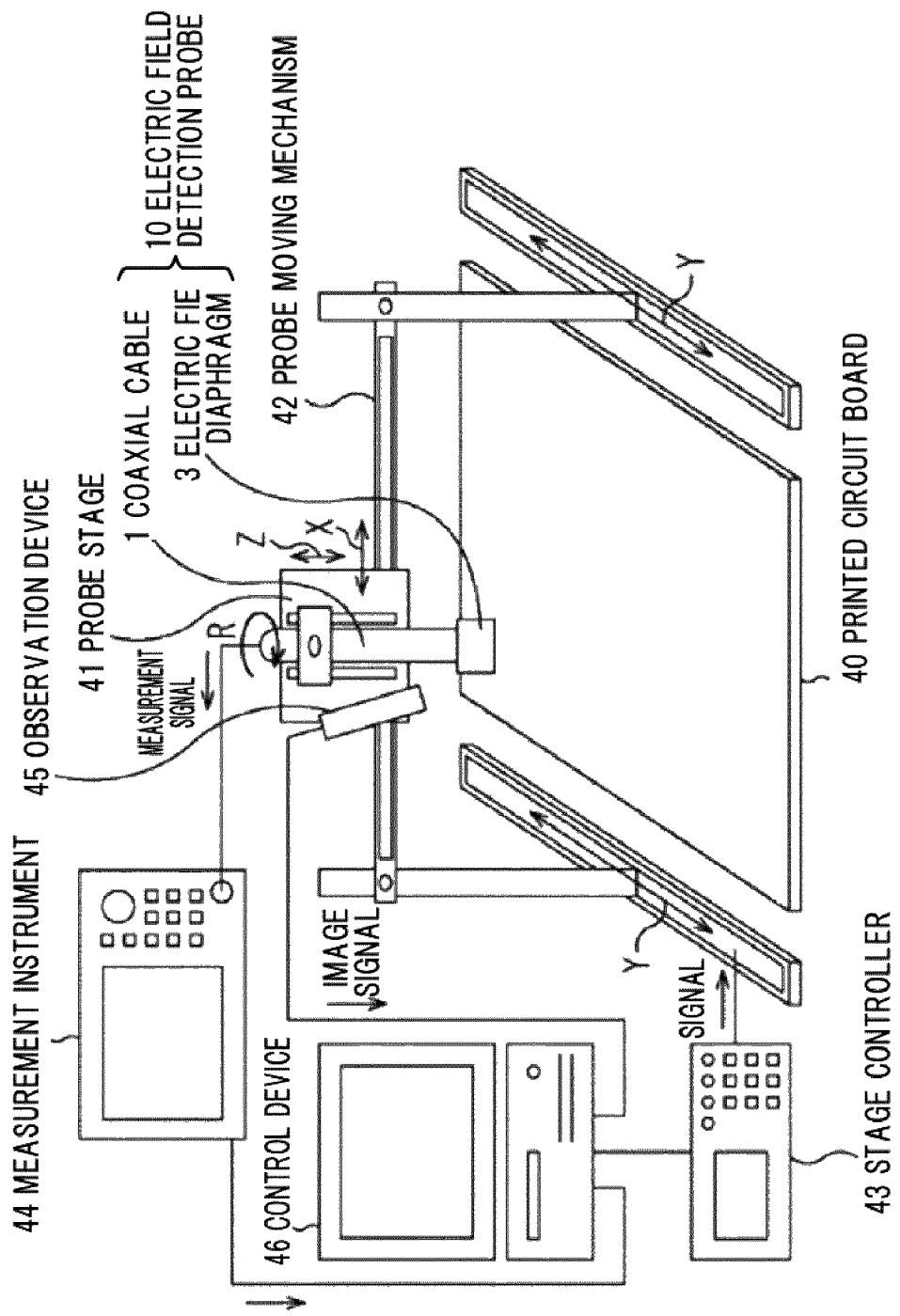
FIG. 3 is a schematic view depicting a configuration of the electric field detection system with the electric field detection probe according to the first example of the first embodiment.
Figure 4:
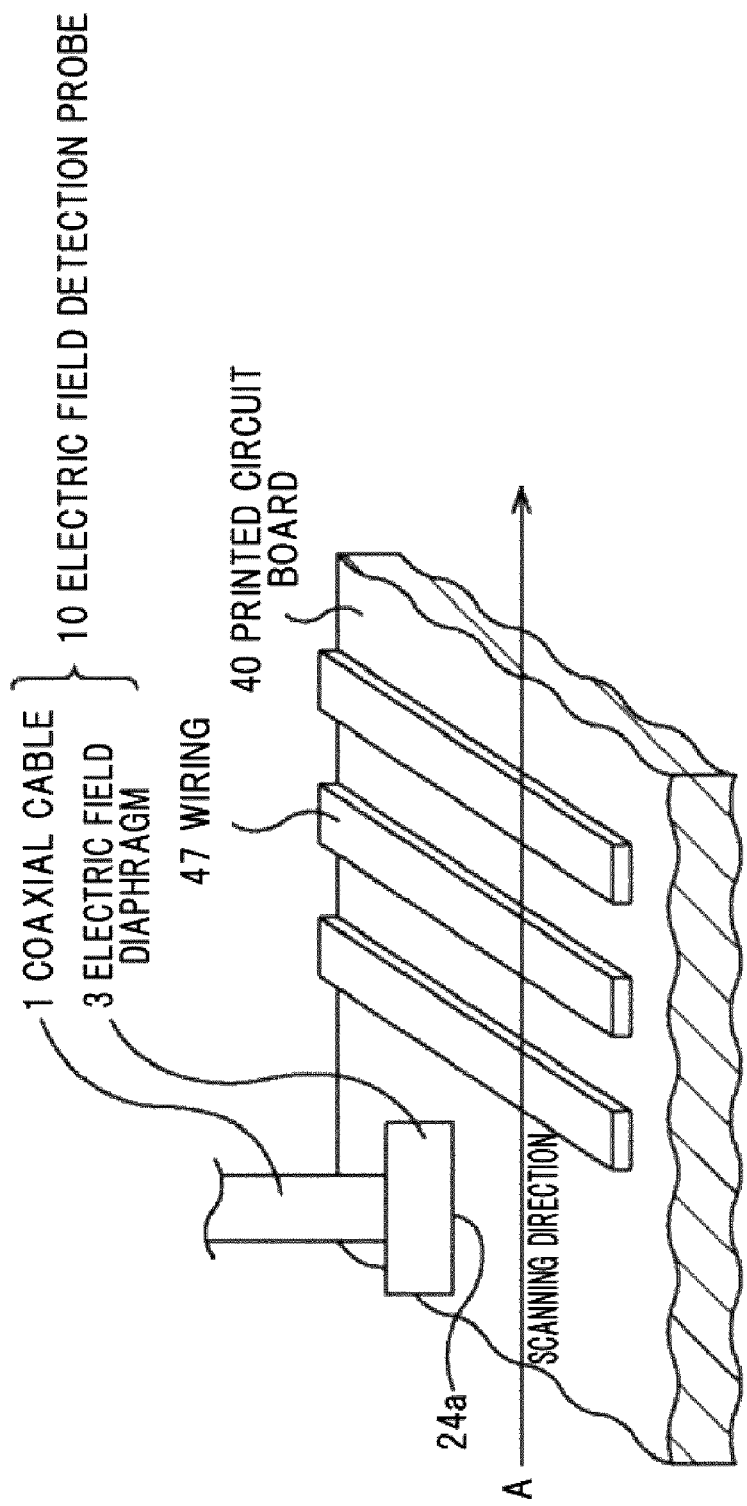
FIG. 4 is a schematic view depicting the electric field detection method using the electric field detection system according to the first example of the first embodiment.

FIG. 3 is a schematic view depicting a configuration of an electric field detection system with an electric field detection probe 10 according to a first example of the first embodiment. FIG. 4 is a schematic view depicting the electric field detection method using the electric field detection system.

In the electric field detection system illustrated in FIG. 3, a reference numeral 41 indicates a probe stage to which an electric field detection probe 10 is mounted. The probe stage 41 is provided with a mechanism that rotates (to a direction of the arrow mark R) the electric field detection probe 10 along a central axis as appropriate. A reference numeral 42 indicates a probe moving mechanism that moves the probe stage 41 to directions of the arrows X, Y, and Z. A reference numeral 43 indicates a stage controller that controls a driving of the probe moving mechanism. A reference numeral 44 indicates a measurement instrument such as a spectrum analyzer that measures and displays electric field distribution detected, for example, by the electric field detection probe 10. A reference numeral 45 indicates an observation device such as a CCD camera that observes images, for example, how wiring lines are scanned by the probe moving mechanism 42. A reference numeral 46 indicates a control device such as a personal computer that centrally controls, for example, the probe stage 41, the prove moving mechanism 42, the stage controller 43, the measurement instrument 44, and the observation device 45.

An electric field detection test of a printed circuit board 40 is conducted as a part of a method for manufacturing the printed circuit board 40.

For example, a wiring 47 is formed appropriately by patterning over the printed circuit board 40 illustrated in FIG. 4 using lithography, for example, based on a wiring diagram (wiring data).

An electric field radiated from the wiring 47 formed over the printed circuit board 40 is detected using the electric field detection system.

The observation device 45 observes the wiring 47 that is subject to the electric field detection over the printed circuit board 40. An image signal generated by the observation device 45 is transmitted to a control device 46 and appropriately displayed on a display unit of the control device 46. The stage controller 43 drives the probe moving mechanism 42 based on a stage control signal from the control device 46. Accordingly, the electric field detection probe 10 mounted on the probe stage 41 scans the wiring 47 to be detected under a non-contact state while maintaining a given distance from the wiring 47. The scanning direction is that crosses a longitudinal direction of the wiring 47; for example, a direction that is orthogonal to the wiring 47 (indicated by the arrow A in FIG. 4). Providing the electric field diaphragm 3 with the electric field detection probe 10 may allow detection of electric field components mostly in the vertical direction radiated from the wiring 47 may be detected as much as possible. A measurement signal generated based on the electric field distribution detected by the electric field detection probe 10 is transmitted to the measurement instrument 44. The measurement instrument 44 may perform spectrum analysis of the electric field distribution detected based on the measurement signal according to the instruction from the control device 46.

As described above, among electric fields radiated from the wiring 47 over the printed circuit board 40, electric fields radiated to a given direction that corresponds to a position where the opening of the electric field diaphragm is formed, in other words, mostly electric fields vertically radiated from the wiring 47 may be detected with a relatively simple configuration and high resolution, and a source of a noise may be located easily, reliably, and highly accurately.

A Second Example of the First Embodiment

A second example of the first embodiment discloses an electric field detection probe in which a configuration of an electric field diaphragm is different from that of the first example of the first embodiment.

FIGS. 5A to 5K are schematic sectional views depicting a manufacturing method of the electric field detection probe according to the second example of the first embodiment in order of the processes.

Figure 5A:
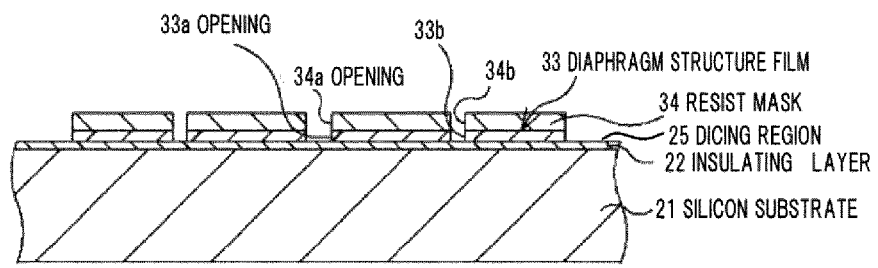
FIGS. 5A to 5K are schematic sectional views depicting a manufacturing method of an electric field detection probe according to a second example of the first embodiment in order of the processes.

As illustrated in FIG. 5A, an SOI layer 23 of an SOI (Silicon(Semiconductor) On Insulator) substrate 20 in FIG. 2A of the first example is processed.

For example, an SOI substrate 20 that includes an SOI layer 23 is prepared over a silicon substrate 21 through an insulating layer 22. A resist is applied over the SOI layer 23 of the SOI substrate 20 and the resist is processed by lithography to form a plurality of resist mask 34, for example, the external shape of each of which is rectangular and with a rectangular opening 34a in the center part and with a plurality of arc annular cutting openings 34b that surround the opening 34a for each chip. The SOI layer 23 is dry-etched using the resist mask 34. A diaphragm structure film 33 the outer shape is rectangular, with a through-hole circular opening 33a in the center part and a plurality of arc annular cutting openings 33b that surrounds the opening 33a is formed over the insulating layer 22 along the shape of the resist mask 34. The opening 33a is formed with a given width of 1 mm or less, in this case, approximately 50 μm to 100 μm. A region between adjacent diaphragm structure films 33 is a dicing region 25 for cutting each chip. The resist mask 34 is removed, for example, by ashing. FIG. 5G illustrates a plan view of the diaphragm structure film 33 after the resist mask 34 is removed.

Figure 5B:
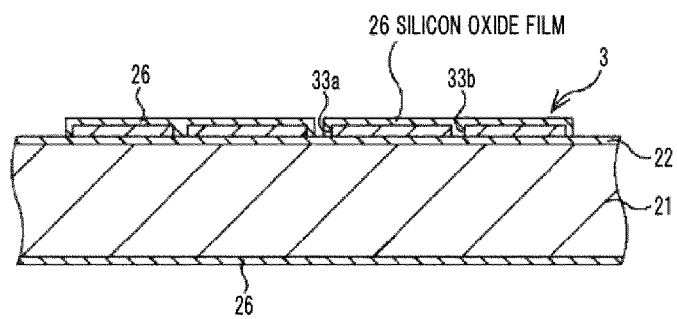

As illustrated in FIG. 5B, a silicon dioxide film 26 is formed.

For example, a whole surface including a back surface of the SOI substrate 20, in other words, a surface of the diaphragm structure film 33 and a back surface of the silicon substrate 21 are thermally-oxidized. A silicon oxide film 26 is formed over the surface of the diaphragm structure film 33 and the back surface of the silicon substrate 21. An insulating film such as a silicon oxide film or a silicon nitride film may be formed over the back surface of the silicon substrate 21, for example, by a Chemical Vapor Deposition (CVD) method instead of forming the silicon oxide film 26 by thermal oxidation.

Figure 5C:
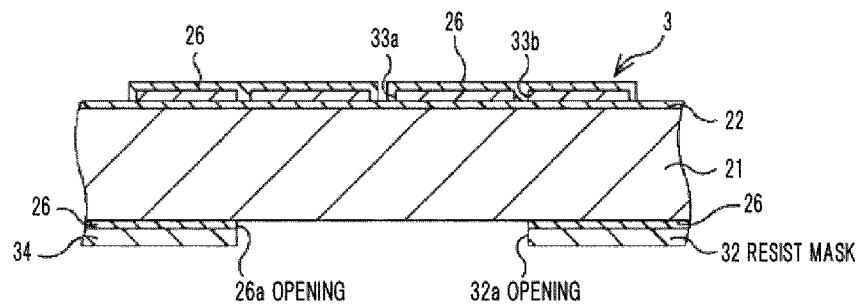

As illustrated in FIG. 5C, the silicon oxide film 26 over the back surface of the silicon substrate 21 is processed.

For example, a resist is applied over the silicon oxide film 26 that is disposed at the back surface of the silicon substrate 21. The resist is processed by lithography to form a resist mask 32 that includes a circular opening 32a, for example, with a diameter of approximately 2.2 mm that is larger than a diameter of a coaxial cable, which will be described later.

The silicon oxide film 26 that is disposed at a back surface of the silicon substrate 21 is wet-etched using the resist mask 32, for example, by hydrogen fluoride (HF) solution. An opening 26a is formed over the silicon oxide film 26 along the opening 32a of the resist mask 32.

Figure 5D:
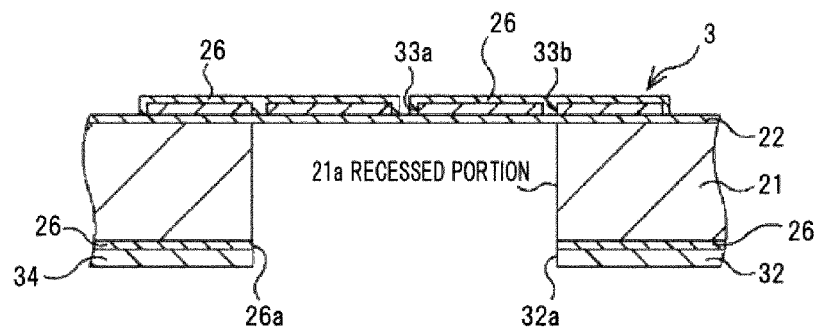

As illustrated in FIG. 5D, a recessed portion 21a is formed over the back surface of the silicon substrate 21.

For example, the back surface of the silicon substrate 21 is dry-etched using the silicon oxide film 26 (and the resist mask 32) as a mask, until the back surface of the silicon oxide film 26 that is disposed over the surface of the silicon substrate 21 is exposed. The recessed portion 21a is formed over the back surface of the silicon substrate 21 along the opening 26a of the silicon oxide film 26. The recessed portion 21a may be formed with a size that allows insertion of a coaxial cable 1 with a diameter of approximately 2 mm.

Figure 5E:
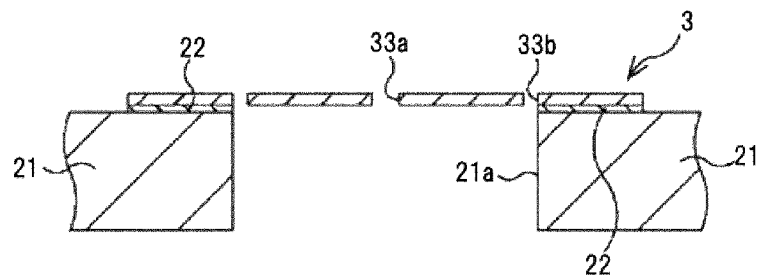

As illustrated in FIG. 5E, the silicon oxide film 26 is removed by wet etching, for example, using hydrofluoric acid (HF) solution. At this time, the resist mask 32 is removed together with the silicon oxide film 26.

Figure 5F:
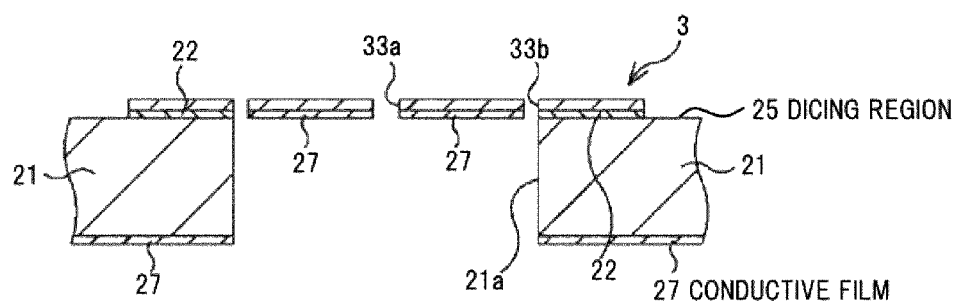
Figure 5G:
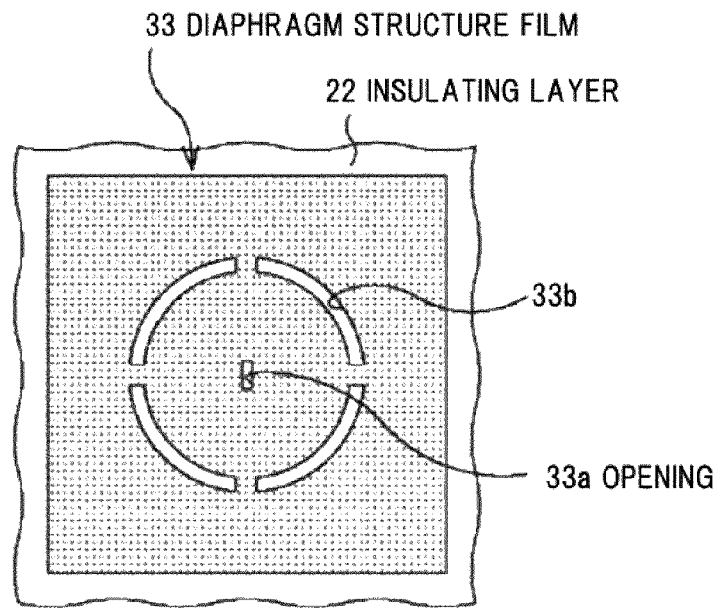

As illustrated in FIG. 5F, a conductive film 27 is formed over the back surface of a SOI substrate 20.

For example, titan (Ti) with a film thickness of approximately 20 nm is formed by sputtering, and gold (Au) or copper (Cu) with a film thickness of about 300 nm is formed, for example, by vacuum deposition method. A conductive film 27 is formed over the back surface of the silicon substrate 21 that includes an inner wall surface of the recessed portion 21a.

Figure 5H:
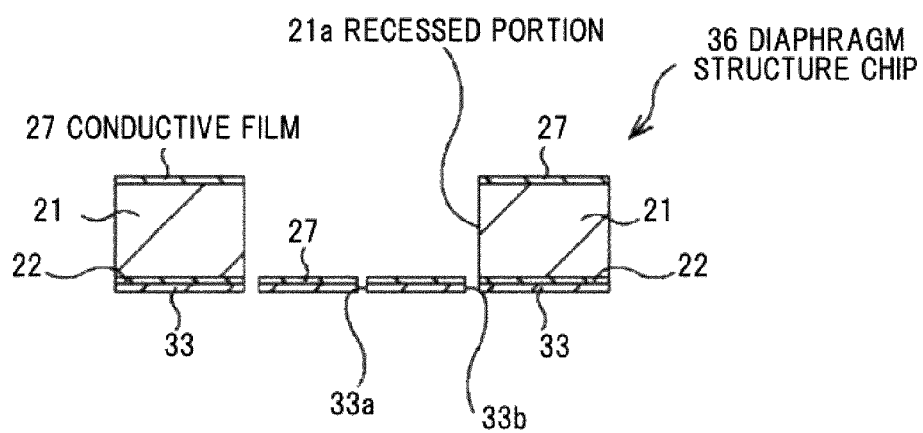

Each diaphragm structure chip 36 illustrated in FIG. 5H is cut along the dicing region 25 of the SOI substrate 20 illustrated in FIG. 5F.

Figure 5I:
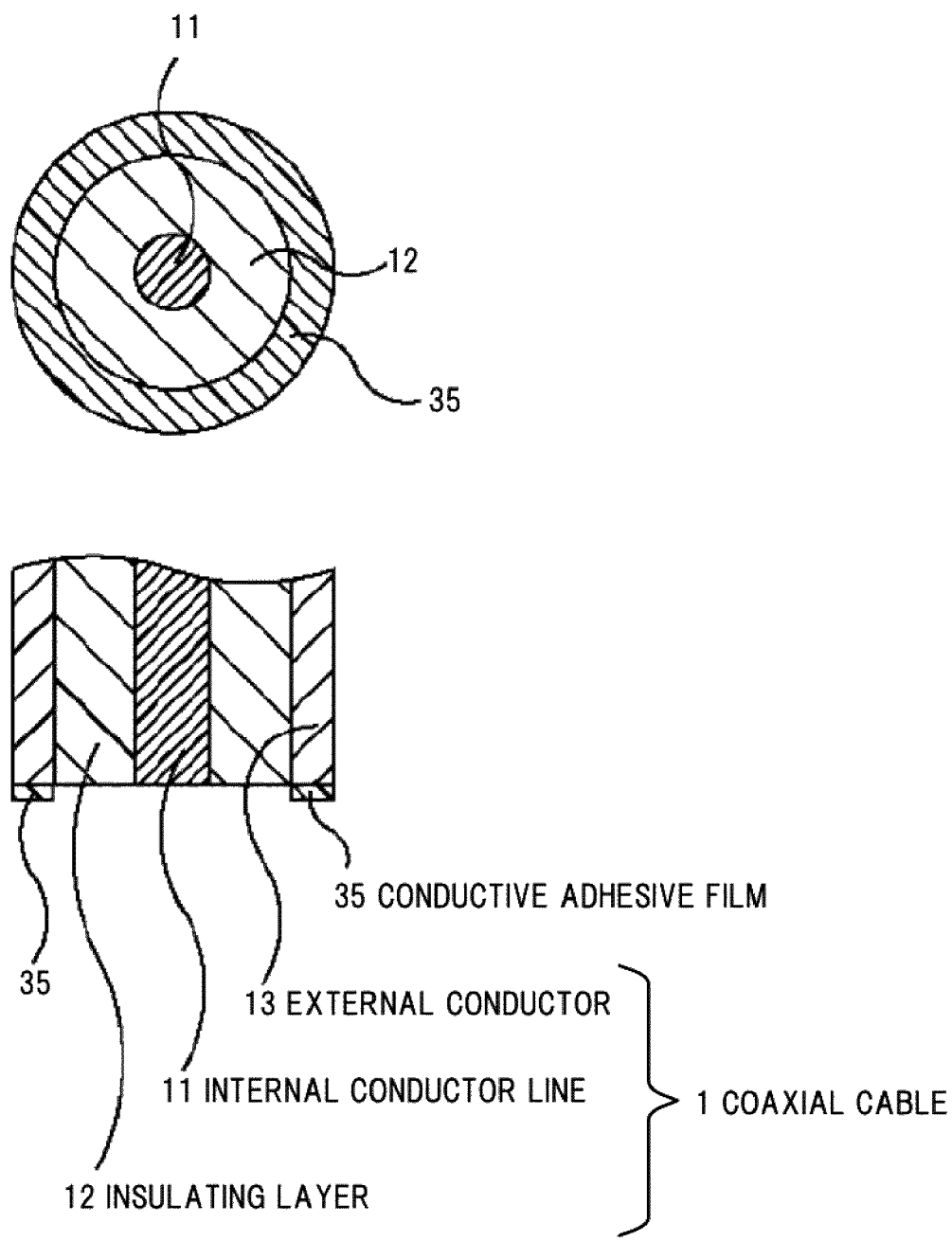

In parallel with the formation of the electric field diaphragm 3, as illustrated in FIG. 5I, a conductive adhesive film 35 is attached so as to cover an annular portion of an external conductor layer 13 that exposes to a tip end of the coaxial cable 1. As the conductive adhesive film 35, for example, a commercially available general-purpose conductive tape may be used.

Figure 5J:
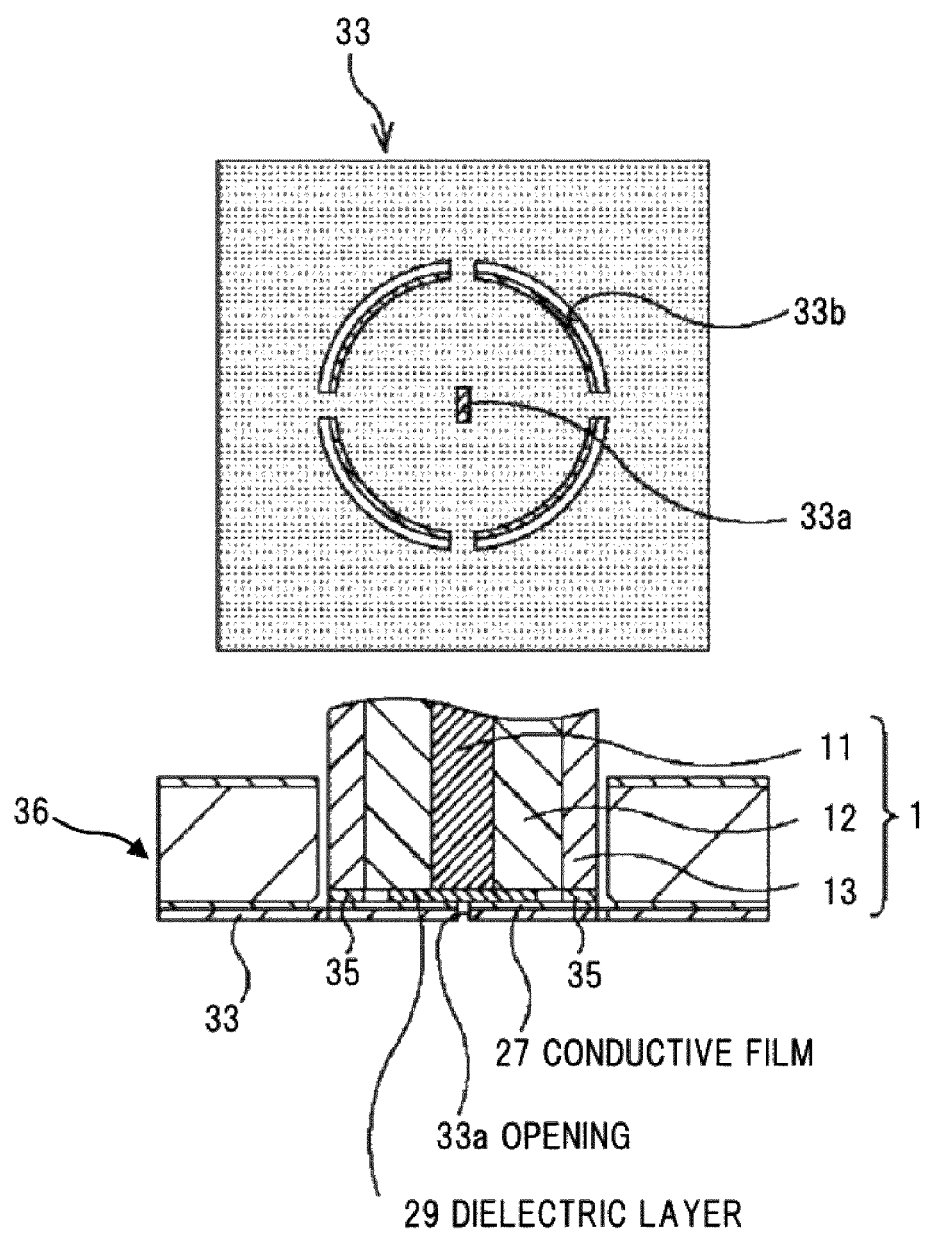

As illustrated in FIG. 5J, the diaphragm structure chip 36 is mounted to the recessed portion 21a of a coaxial cable 1.

For example, as illustrated in FIG. 5J, a dielectric layer 29, for example, of silicon oxide or silicon nitride is formed over a conductive film 27 at the bottom of the recessed portion 21a of the diaphragm structure chip 36 as illustrated in FIG. 5H. The dielectric layer 29 is not necessarily formed. A tip end of a coaxial cable 1 that is substantially the same as the coaxial cable illustrated in FIG. 1A is inserted into the recessed portion 21a of the diaphragm structure chip 36 so that the tip end 11a of the internal conductor line 11 is aligned with the opening 33a through the dielectric layer 29. The conductive adhesive film 35 fixes the coaxial cable 1 in the recessed portion 21a of the diaphragm structure chip 36 and electrically couples the external conductor layer 13 of the coaxial cable 1 and the conductive film 27.

Figure 5K:
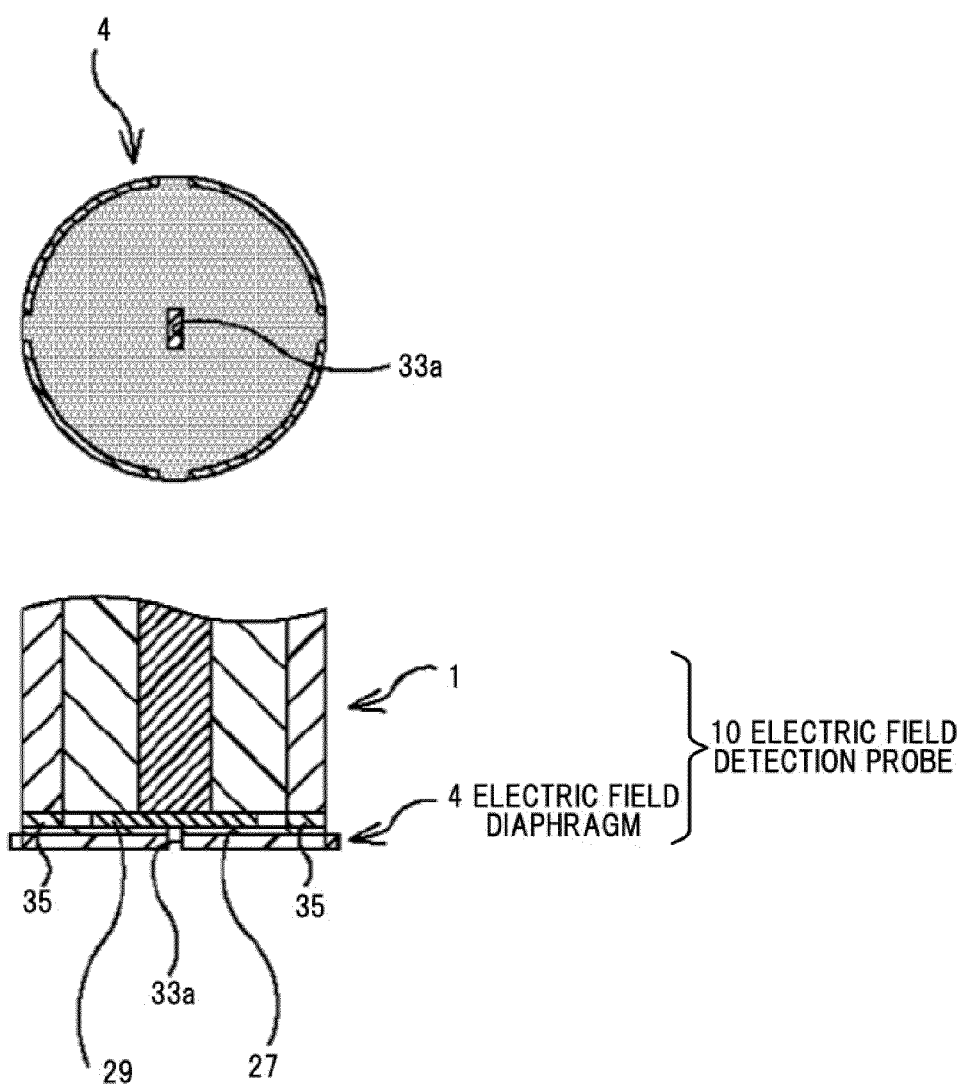

After a given time, as illustrated in FIG. 5K, an unnecessary portion of the diaphragm structure chip 36 is removed.

For example, portions between adjacent cutting openings 33b of the diaphragm structure film 33 is cut, for example, by laser processing to obtain an inner part of a circle of the cutting opening 33b of the diaphragm structure 33. As a result, a planar electric field diaphragm 4 is formed in which the tip end 11a of the internal conductor line 11 and the opening 33a is aligned to face each other.

Figure 6:
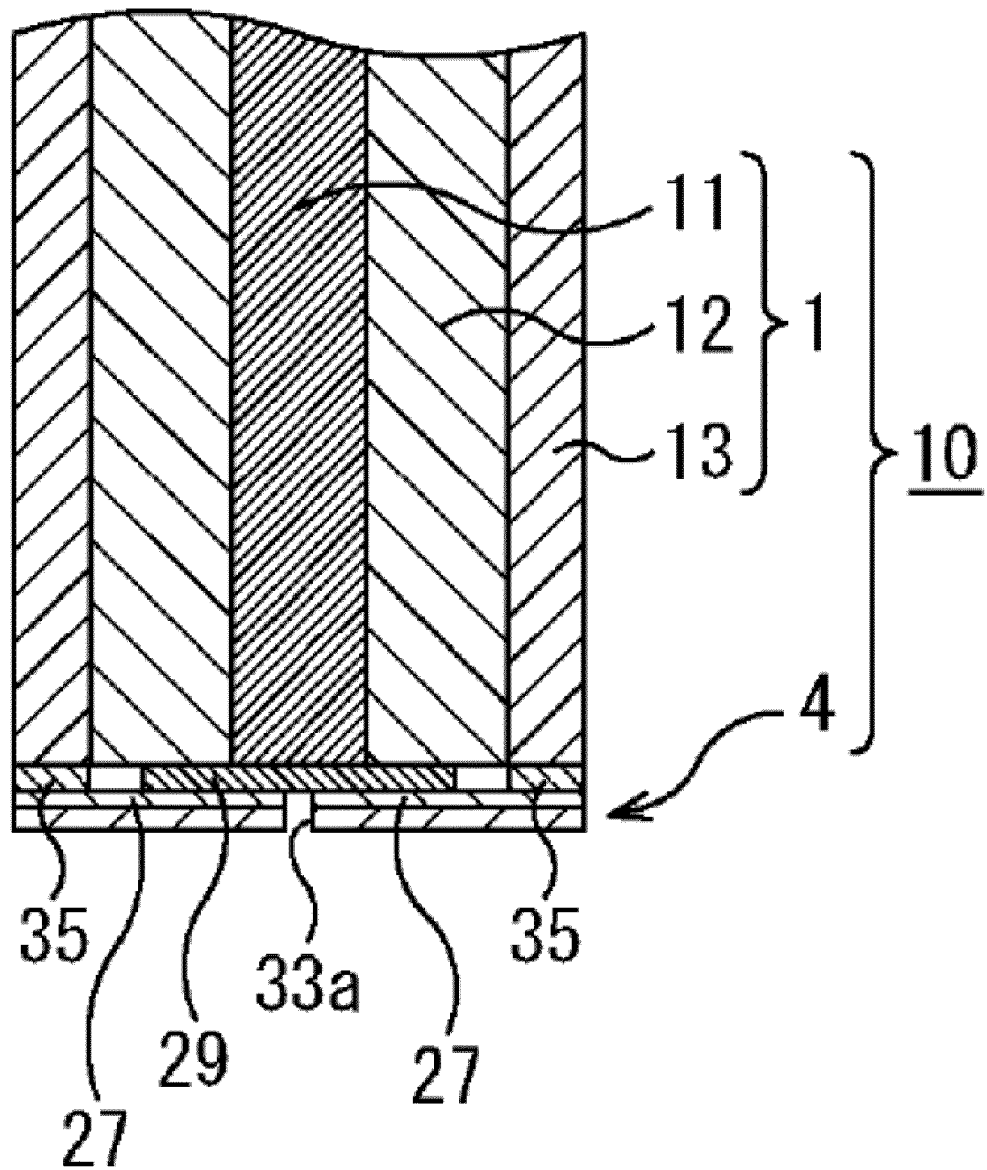
FIG. 6 is a schematic sectional view of the electric filed detection probe according to the second example of the first embodiment.

As described above, the electric field detection probe 10 with the coaxial cable 1 and the electric field diaphragm 4 are formed as illustrated in FIG. 6.

In the electric field detection probe 10 according to the second example, the electric field diaphragm 4 is substantially the same planar shape and the size as the tip end of the coaxial cable 1. Thus, increasing a size of the tip end may not be needed even if the electric field diaphragm 4 is provided when a fine wiring is detected and the size of the tip end needs to be further reduced.

According to the second example, among electric fields radiated from the wiring 47 over the printed circuit board 40, an electric field radiated to a given direction that corresponds to a position where the opening of the electric field diaphragm is formed, in other words, an electric field vertically radiated from the wiring 47 may be detected with a relatively simple configuration and high resolution and a source of a noise may be located easily, reliably, and highly accurately.

A Third Example of the First Embodiment

A third example of the first embodiment discloses an electric field detection probe in which a configuration of an electric field diaphragm is different from aforementioned examples of the first embodiment.

Figure 7A:
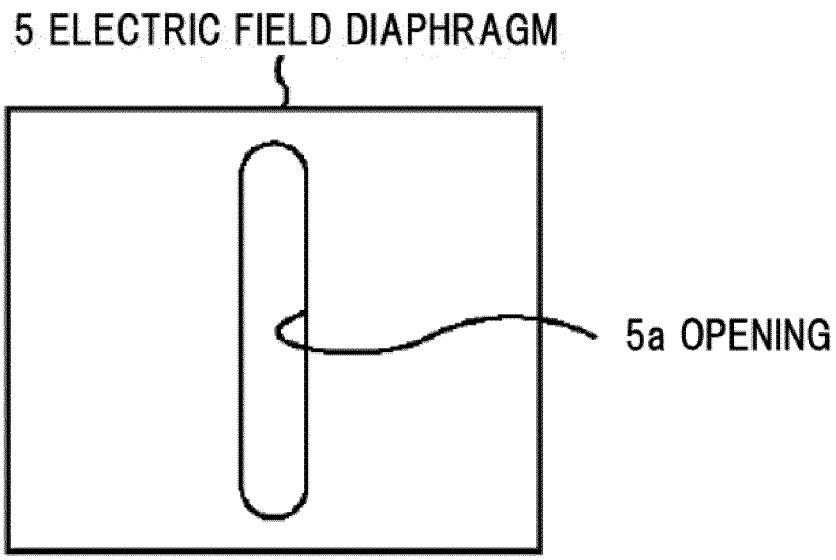
FIGS. 7A to 7B are schematic plan views depicting an electric field diaphragm of an electric field detection probe according to a third example of the first embodiment.
Figure 7B:
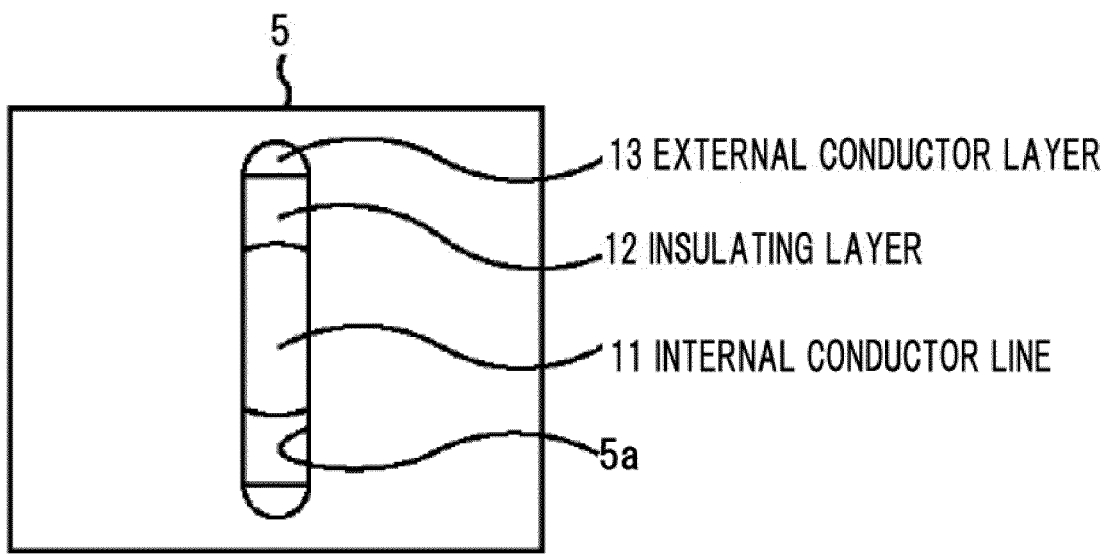

FIGS. 7A to 7B are schematic plan views depicting electric field diaphragm of an electric field detection probe according to a third example of the first embodiment.

In the third example, an electric field detection probe 10 may include a coaxial cable 1 and an electric field diaphragm 5 disposed at a tip end of the coaxial cable 1.

The diaphragm 5 is configured substantially the same as the diaphragm 3 illustrated in FIG. 2. However, as illustrated in FIG. 7A, an opening 5a is a slit shape that is longer than the opening 3a of the diaphragm 3. FIG. 7B illustrates the diaphragm 5 to which the coaxial cable 1 is mounted. A dielectric layer 29 is not illustrated for the sake of convenience. In the third example, the opening 5a is formed with a slit shape that is longer than a diameter of a tip end 11a of an internal conductor line 11.

A length of the opening 5a (longitudinal width) is preferably a given value that is 1/10 of a wavelength of electromagnetic wave radiated from a wiring to be measured or less.

If a diameter of the opening is substantially the same as the measuring wavelength, entire amplitude range for one wavelength is detected and the detected value may be 0 as a result of integration. A sufficient value may be detected if a diameter of the opening is 1/10 of a measuring wavelength or less. In this case, for example, a length of the opening 5a may be a given value of approximately 1 mm or less in view of that, for example, a wavelength of an electromagnetic wave is approximately 10 mm for an electric signal of 10 GHz.

Figure 8A:
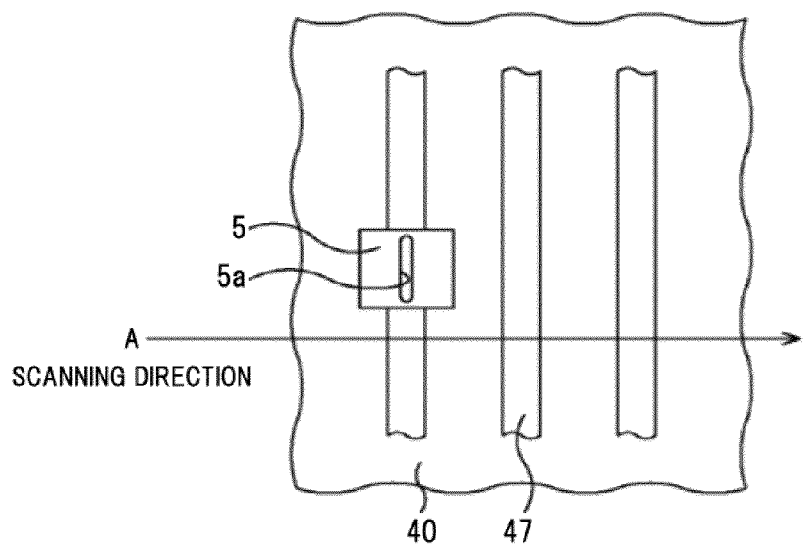
FIGS. 8A to 8B are schematic views depicting a method for detecting an electric field using an electric field detection probe according to the third example of the first embodiment.

When the electric field detection probe 10 detects an electric field of a wiring 47 over a printed circuit board 40, as illustrated in FIG. 8A, a longitudinal direction of the opening 5a of the electric field diaphragm 5 is aligned with an extending direction of the wiring 47, and scans to the direction that crosses, for example, orthogonally to the wiring extending direction (direction indicated by the arrow A).

The larger an area of the opening of the electric field diaphragm becomes, the detection sensitivity for electric fields may be improved, and the smaller the area of the opening of the electric field diaphragm becomes, spatial resolution of electric field detection may become more enhanced. According to the third example, an area to which an electric field passes through is enlarged by making the opening 5a to a slit-shape, thus the detection sensitivity may be improved. Electric field components radiated from the wiring 47 are mainly components orthogonal to a running direction of the wiring 47 and components vertically radiated from the wiring 47, and electric field components along the running direction of the wiring 47 is an infinitesimal that may be ignored. Aligning the longitudinal direction of the opening 5a of the electric field diaphragm 5 with the extending direction of the wiring 47 and making the electric field diaphragm 5 scan orthogonally to the extending direction of the wiring 47 enlarge the opening area for the running direction of the wiring 47, and vertical components radiated directly above the wiring 47 dominates the detected electric field components. Thus, using the electric field detection probe 10 with the electric field diaphragm 5 may detect electric field with high sensitivity without reducing spatial resolution compared to when the electric field diaphragm 3 is used.

Figure 8B:
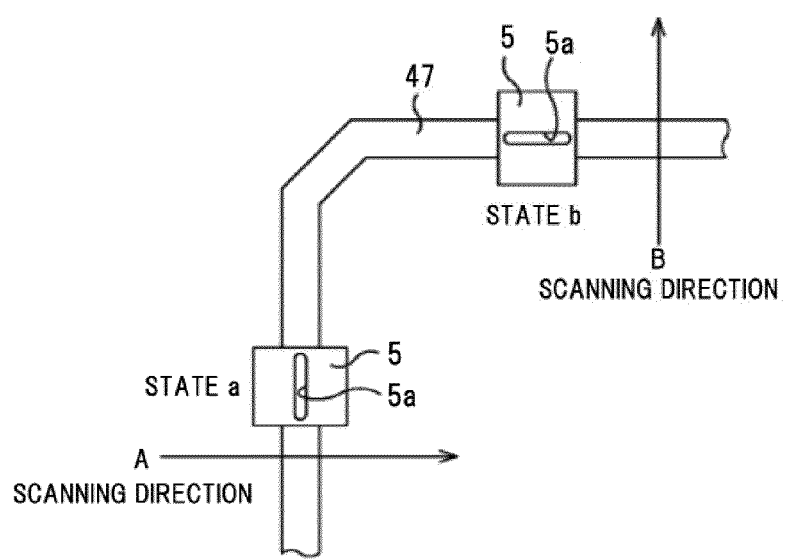

As illustrated in FIG. 8B, when the wiring 47 is bent, the electric field diaphragm 5 is rotated based on a wiring diagram or an image acquired from an observation device 45 as illustrated in FIG. 3 to align the longitudinal direction of the opening 5a with the extending direction of the wiring 47. The stage controller 43 illustrated in FIG. 3 drives the probe moving mechanism 42 based on a stage control signal from the control device 46 and appropriately moves the electric field detection probe 10 mounted to the probe stage 41 and rotates the electric field detection probe 10 as indicated by the arrow R. The movement and rotation changes a state of the electric field diaphragm 5 of the electric field detection probe 10 from a state a in which a scanning direction is A direction into a state b in which a scanning direction is B direction.

According to the third example, among electric fields radiated from the wiring 47 over the printed circuit board 40, mostly electric fields radiated to a given direction that corresponds to a position where the opening of the electric field diaphragm is formed, in other words, electric fields vertically radiated from the wiring 47 may be detected with a relatively simple configuration and high sensitivity and spatial resolution. A source of a noise may be located easily, reliably, and highly accurately.

A Fourth Example of First Embodiment

A fourth example of the first embodiment discloses an electric field detection probe in which a configuration of an electric field diaphragm is different from that of the aforementioned examples of the first embodiment.

Figure 9A:
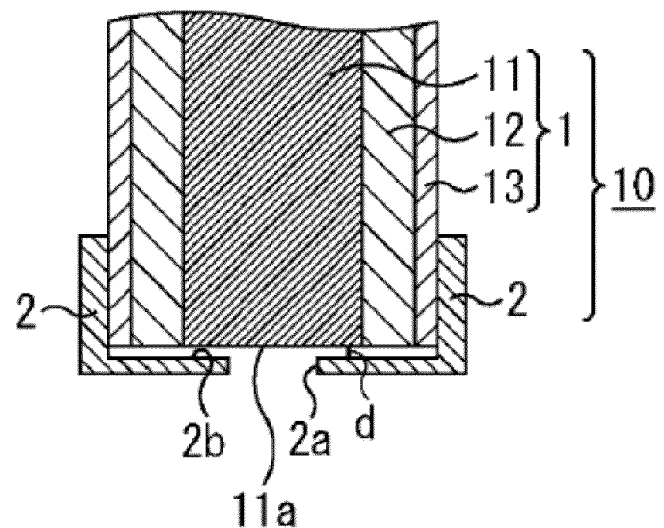
FIGS. 9A to 9B are schematic sectional views depicting a configuration and a principle of the electric field detection probe according to a fourth example of the first embodiment.
Figure 9B:
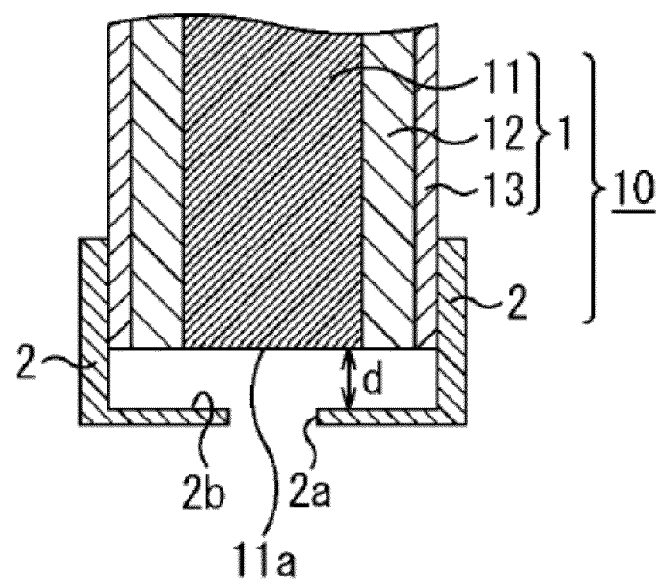

FIGS. 9A to 9B are schematic sectional views depicting a configuration and principle of the electric field detection probe according to a fourth example of the first embodiment. FIGS. 10A to 10D are schematic sectional views depicting a manufacturing method of the electric field detection probe according to the fourth example of the first embodiment.

As an example, the electric field detection probe 10 illustrated in FIG. 1 will be explained. As illustrated in FIGS. 9A and 9B, in the electric field detection probe 10, it is assumed that a space distance d between a tip end 11a of an internal conductor line 11 of a coaxial cable 1 and a opposite face 2b of the electric field diaphragm that faces the tip end 11a is changed. In this case, a cavity resonance may occur in which mostly electromagnetic waves in a given frequency based on the space distance resonate. When a noise frequency is known, an electric field for an electromagnetic wave of a given frequency may be detected with high sensitivity by setting a space distance d to a distance that the frequency specifically resonates.

Based on a manufacturing method illustrated in FIGS. 9A to 9B, the fourth example discloses a configuration in which a space distance d is variable so that a cavity resonance is caused depending on a wavelength of an electromagnetic wave radiated from a wiring to be detected.

Figure 10A:
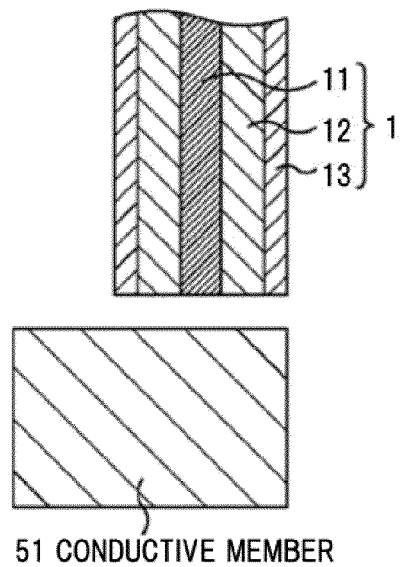
FIGS. 10A to 10D are schematic sectional views depicting a manufacturing method of the electric field detection probe according to the fourth example of the first embodiment.

As illustrated in FIG. 10A, a coaxial cable 1 and a block-shaped conductive member 51 that becomes an electric field diaphragm are prepared. As a conductive member 51, metal such as copper (Cu) is preferable.

Figure 10B:
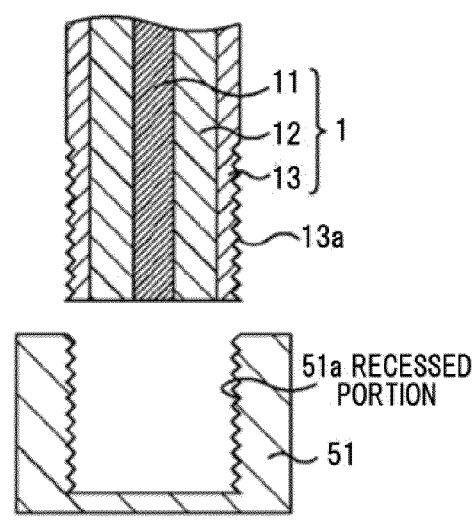

As illustrated in FIG. 10B, a groove 13a is formed over the coaxial cable 1 and a recessed portion 51a is formed in the conductive member 51 respectively to fit each other.

For example, the groove 13a is formed over sides of an external conductor layer 13 around a tip end of the coaxial cable 1. A pitch of a screw is not specifically limited; however, a shorter pitch is preferable when a wavelength of an electromagnetic wave is finely changed. The recessed portion 51a is formed by cutting a groove over the conductive member 51 so as to fit in the groove 13a. A thickness of a bottom of the recessed portion 51a is a few mm, for example, approximately 2 mm.

Figure 10C:
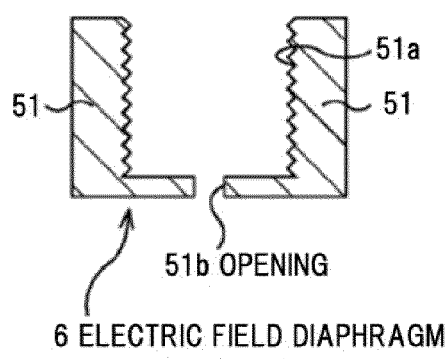

An electric field diaphragm 6 is formed as illustrated in FIG. 10C.

For example, a through-hole is formed in a central part of the bottom of the recessed portion 51a, for example, by electric discharge or laser processing to form the electric field diaphragm 6 with an opening 51b.

Figure 10D:
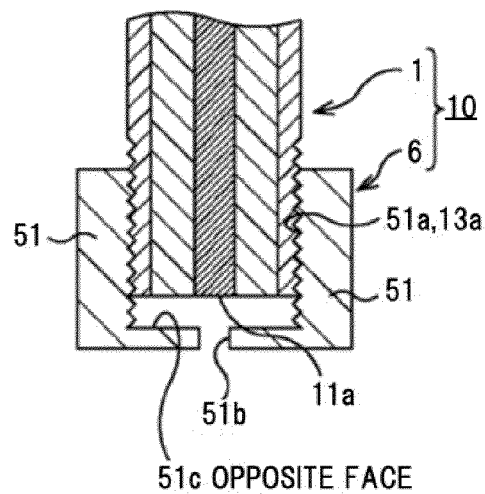

As illustrated in FIG. 10D, the groove 13a around the tip end of the coaxial cable 1 is screwed with the recessed portion 51a of the electric field diaphragm 6 to obtain the electric field detection probe 10. Rotating the coaxial cable 1 against the electric field diaphragm 6 adjusts the screwed state to change the space distance between the tip end 11a of the internal conductor line 11 and the opposite face 51c of the electric field diaphragm 6 may be appropriately changed.

According to the fourth example, among electric fields radiated from the wiring 47 over the printed circuit board 40, mostly electric fields radiated to a given direction corresponds to a position where the opening of the electric field diaphragm is formed, in other words, electric fields vertically radiated from the wiring 47 may be detected with a relatively simple configuration and high resolution by adjusting to a measuring wavelength as appropriate and a source of noise may be located easily, reliably, and highly accurately.

A Fifth Example of First Embodiment

A fifth example discloses an electric field detection probe in which a configuration of an electric field diaphragm is different from the aforementioned examples of the first embodiment.

Figure 11A:
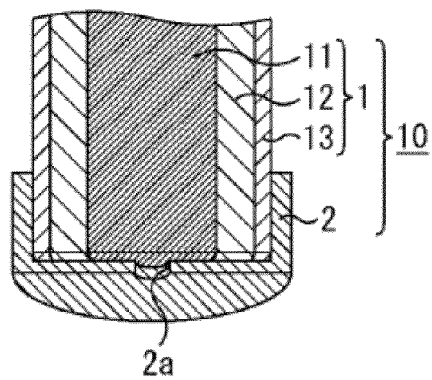
FIGS. 11A to 11C are schematic sectional views depicting a configuration and a principle of an electric field detection probe according to a fifth example of the first embodiment.
Figure 11B:
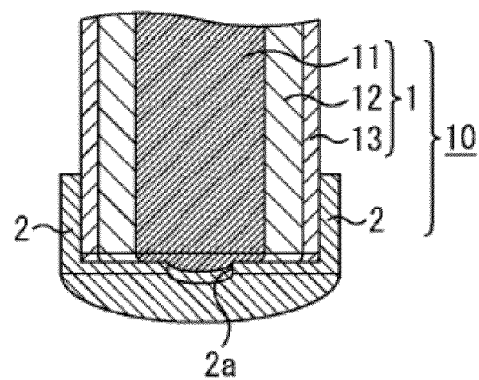
Figure 11C:
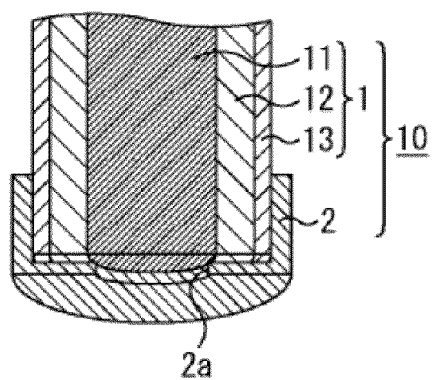

FIGS. 11A to 11C are schematic sectional views depicting a configuration and principle of the electric field detection probe according to a fifth example of the first embodiment. FIGS. 12A to 12B are schematic view depicting a configuration of a variable diaphragm mechanism used for an electric field detection probe according to the fifth example of the first embodiment.

As an example, the electric field detection probe 10 illustrated in FIG. 1 will be described. As illustrated in FIGS. 11A to 11C, changing a diameter of an opening 2a of an electric field diaphragm 2 is assumed.

As illustrated in FIG. 11A, when an electric field detection probe 10 that includes an electric field diaphragm with the opening 2a the diameter of which is small is used, an oblique components of an electric field to an opening 2a are blocked and mostly electric field components radiated vertically from a wiring to be detected may reach to an internal conductor line 11 through the opening 2a. Thus, a source of a noise may be identified with high positional accuracy by detecting an electric field mostly while the opening 2a is positioned directly over the wiring.

As illustrated in FIG. 11B and moreover FIG. 11C, when an electric probe 10 that includes an electric field diaphragm 2 with an opening 2a the diameter of which is large is used, many oblique components of electric fields to the opening 2a may be detected. As a result, the spatial resolution may be decreased; although detection sensitivity may be improved for the decreased spatial resolution. Accordingly, a relatively rough source of an electric field noise may be located.

According to the fifth example, a configuration in which a diameter of the opening 2a is variable depending on a state of electric field detection will be explained by referring to FIG. 12. FIG. 12A is an elevation view, and FIG. 12B is a side elevation view respectively.

A variable diaphragm mechanism 52 may include a variable diaphragm unit 53 which adjusts a diameter of an opening 53a and a diaphragm adjustment unit 54 for driving the variable diaphragm unit 53. The diaphragm adjustment unit 54 may adjust a diaphragm by manual operation or automatically through an external control.

According to the fifth example, in the electric field detection probe 10, the variable diaphragm mechanism 52 is mounted so that the opening 53a is aligned with the opening 2a of the electric field diaphragm 2.

Figure 13:
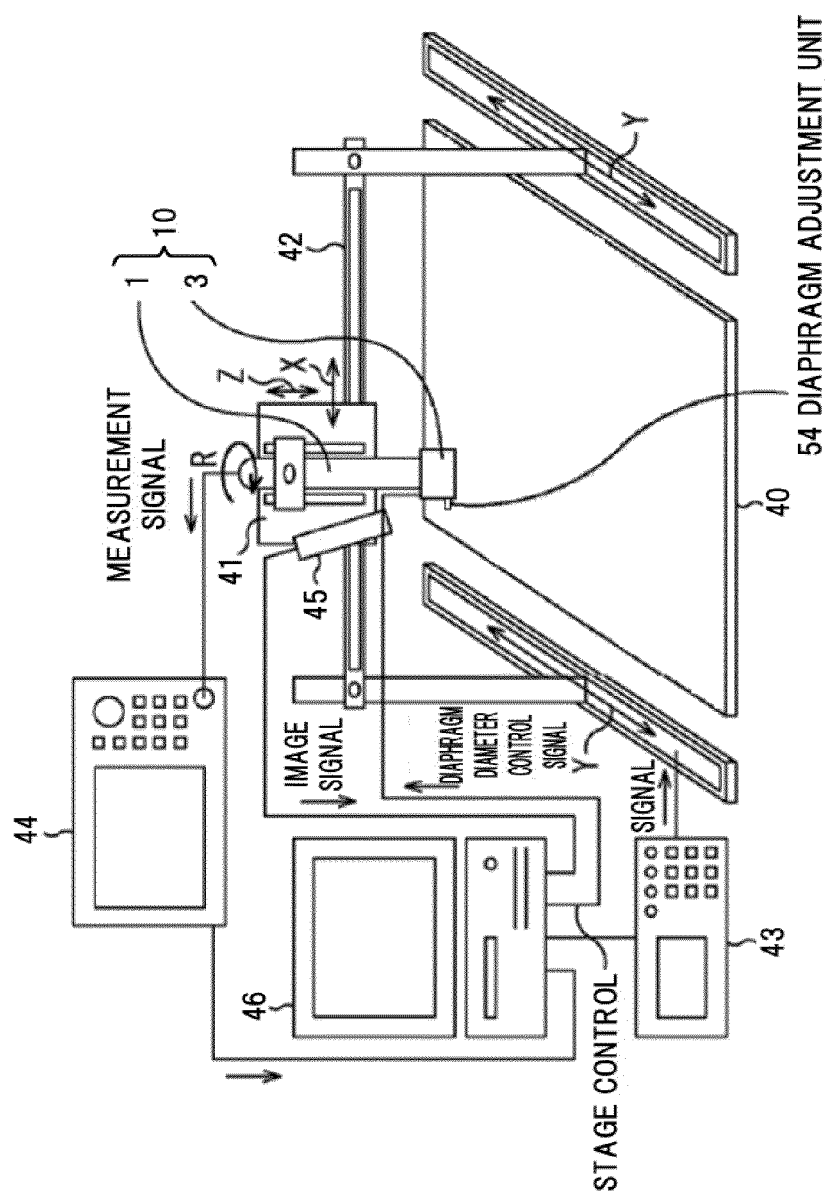
FIG. 13 is a schematic view depicting a schematic configuration of an electric field detection system with an electric field detection probe according to the fifth example of the first embodiment.

FIG. 13 is a schematic view depicting a configuration of an electric field detection system with an electric field detection probe 10 according to the fifth example of the first embodiment.

The electric field detection system according to the fifth example is configured substantially the same as the electric field detection system according to the example illustrated in FIG. 3. However, the variable diaphragm 53 of the variable diaphragm mechanism 52 illustrated in FIG. 12a may be controlled by a diaphragm control signal from the control unit 46.

In order to detect an electric field using the electric field detection system, the control unit 46 controls and makes the variable diaphragm unit 53 open widely to relatively roughly scan the wiring 47 to search a source of an electric field noise.

A measurement instrument 44 may roughly identify a source of electric field noise, for example, by conducting a spectrum analysis based on the search result.

The control device 46 narrows a diameter of the opening 53a by controlling the variable diaphragm 53 so that detailed scanning may be performed. Under the condition, the electric field detection probe 10 scans the wiring 47 to identify a source of the electric noise highly accurately.

According to the fifth example, among electric fields radiated from the wiring 47 over the printed circuit board 40, electric fields radiated to a given direction that corresponds to a position where the opening of the electric field diaphragm is formed, in other words, electric fields vertically radiated from the wiring 47 may be detected with a relatively simple configuration and high resolution and a source of noise may be located easily, reliably, and highly accurately.

Second Embodiment

A second embodiment presents an electric field detection probe that detects, among electric fields radiated from a wiring over a printed circuit board, mostly electric fields radiated to a given direction in a plane that includes the wiring with a relatively simple configuration and high resolution. The electric field radiated to the given direction may be an electric field component radiated vertically to a longitudinal direction of the wiring, or an electric field component radiated in parallel with the longitudinal direction of the wiring, and mostly the electric field components may be detected.

Figure 14A:
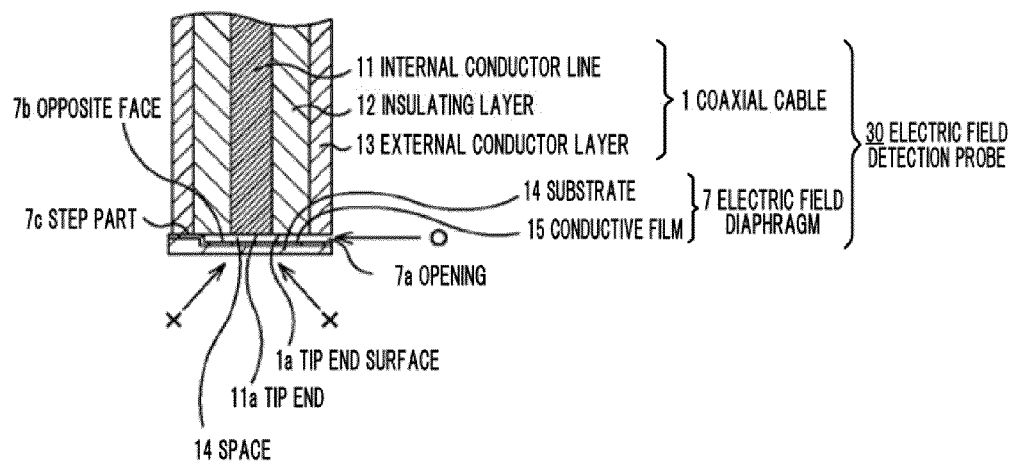
FIGS. 14A to 14C are sectional views depicting a configuration of the electric field detection probe according to a second embodiment.
Figures 14B, 14C:
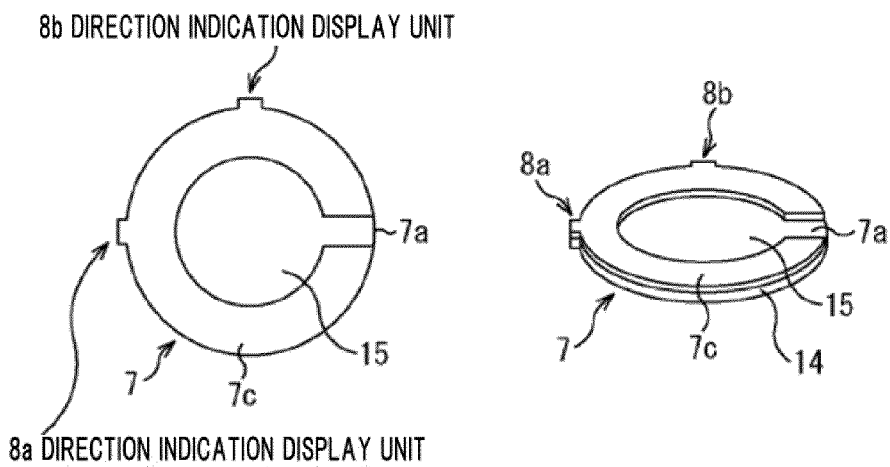

FIGS. 14A to 14C are schematic sectional views depicting a configuration of the electric field detection probe according to the second embodiment.

As illustrated in FIG. 14A, an electric field detection probe 30 may include a coaxial cable 1 and an electric field diaphragm 7 disposed at a tip end of the coaxial cable 1.

As in the first embodiment, the coaxial cable 1 exposes a tip end 11a of an internal conductor line 11 and may include an insulating layer 12 that coats a surface of the internal conductor line 11, and an external conductor layer 13 that coats the insulating layer 12.

As illustrated in FIGS. 14B and 14C, the electric field diaphragm 7 is formed by covering one of principal planes of the substrate 14 with a conductive film 15. The substrate 14 is, for example, a circular shape and a step part 7c with an annular convex is formed with a thickness of approximately 100 nm to 500 μm over an edge of one of the principal planes. A part of the step part 7c is cut to form an opening 7a with a given width that leads to an inner part of the annular convex.

As the opening 7a, for example, an opening with a width of approximately 100 nm to 500 μm and a height of about 100 nm to 500 μm is preferable. The conductive film 15 is for achieving electric conduction with the external conductor layer 13.

In the electric field diaphragm 7, a direction indication display unit 8a is formed at a part that faces to the opening 7a at the side of the electric field diaphragm 7, and a direction indication display unit 8b is formed at a middle point between the opening 7a at the side of the electric field diaphragm 7 and the direction indication display unit 8a. The direction indication display unit 8a and direction indication display unit 8b may be an indicator for recognizing a disposed state of the electric field diaphragm 7 in relation to a scanning direction of the electric field detection probe 30. The positions of direction indication display units 8a and 8b are not limited to the above described positions and shapes may be other shapes. The direction indication display unit 8a may be provided without providing the direction indication display unit 8b. For example, other additional direction indication display unit may be provided at a position facing the direction indication display unit 8b at the side of the electric field diaphragm 7.

In the electric field detection probe 30, the electric field diaphragm 7 is electrically coupled to an external conductor layer 13 of a coaxial cable 1 through a conductive film 15 at the step part 7c and mounted to the coaxial cable 1 so as to cover a tip end surface 1a of the coaxial cable 1. The tip end 11a of the internal conductor line 11 and a plane 7b that faces the tip end surface 1a of the electric field diaphragm 7 is spaced apart, for example, approximately 50 nm to 1 mm by the step part 7c because the internal conductor line 11 and the conductive film 15 are to be insulated. The internal conductor line 11 and the conductive film 15 is insulated by air due to a gap caused by the space 14, however a dielectric layer such as a resin may be inserted as appropriate in the space 14. In FIG. 14, one of main planes of the diaphragm 7 is circular so as to correspond to a shape of the coaxial cable 1 of the diaphragm 7, however, rectangular, polygonal or other shapes is preferable as well.

In the electric field diaphragm 7, the conductive film 15 is formed at least at a part facing the tip end surface 1a of the coaxial cable 1 that includes the tip end 11a and an edge of the conductive film 15 is exposed from the opening 7a. Thus, as illustrated in FIG. 14A, the electric field diaphragm 7 may block electric field components to directions other than those to a given direction in a plane that includes the opening 7a from a wiring to be measured and noise electromagnetic fields (schematically indicated by an arrow with X) radiated from the adjacent wirings of the wiring to be measured as much as possible when the electric field detection probe 30 is used for detecting electric field radiated from wirings over a substrate. Accordingly, an electric field radiated to a given direction in a plane that includes a wiring to be measured (schematically indicated by an arrow with a circle) is detected from the tip end 11a of the internal conductor line 11 through the opening 7a. As described above, the electric field detection probe 30 may extract and detect electric field components mostly radiated to a given direction in the plane that includes a wiring to be measured with high accuracy, and locate a source of noise radiation with high spatial resolution. The tip end 11a may be projected from the tip end surface 1a to the extent that the tip end 11a does not contact with the conductive film 15 so that the tip end 11a of the internal conductor line 11 directly and reliably detects electric field components that pass the opening 7a.

As the coaxial cable 1, a commercially available general-purpose cable may be used. The coaxial cable may be easily replaced by employing a method in which the electric field diaphragm 7 is mounted over the coaxial cable.

Figure 15:
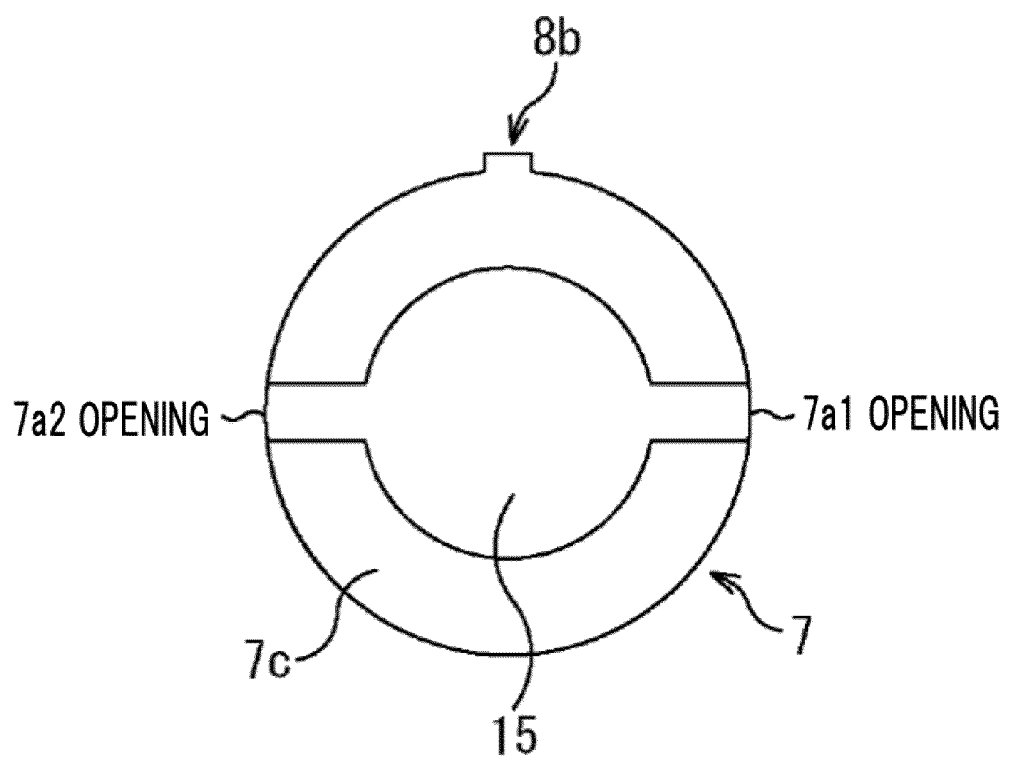
FIG. 15 illustrates another example of an electric field diaphragm of the electric field detection probe according to the second embodiment.

As the electric field diaphragm 7, a plurality of openings, for example, two openings 7a1 and 7a2 may be provided as illustrated in FIG. 15. The electric field diaphragm 7 is provided with the opening 7a1 in substantially the same manner as the opening 7a, and the opening 7a2 is provided at a part facing the opening 7a1 at the step part 7c. In this case, as a direction indication display unit, for example, a direction indication display unit 8b is provided at a middle point between the opening 7a1 and the opening 7a2. Sensitivity to detect electric field components radiated to a given direction in the plane that includes an object to be detected may be substantially improved by providing the opening 7a1 and the opening 7a2 which face each other at sides of the electric field diaphragm 7.

Figure 16:
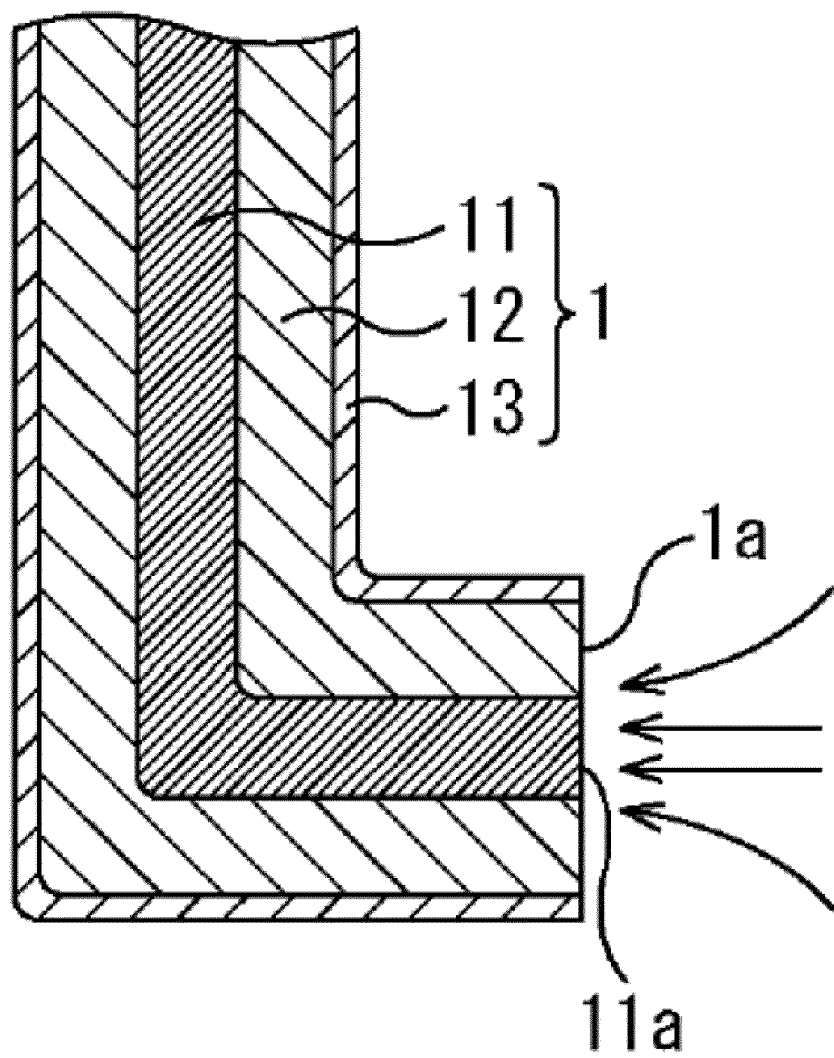
FIG. 16 is a sectional view depicting a schematic configuration of an electric field detection probe that is a comparison example of the second embodiment.

FIG. 16 is a sectional view depicting a configuration of an electric field detection probe that is a comparison example of the second embodiment.

In the comparison example, a coaxial cable 1 without an electric field diaphragm 7 is used and a tip end of which is bent for 90 degree. It is assumed that an electric field component radiated to a given direction in a plane that includes an object to be measured is detected using the configuration. However, the configuration leads to a larger size of the tip end part due to the tip end part is bent, and detecting a fine and complicated wiring is difficult. Moreover, the tip end part 11a of the internal conductor line 11 is exposed, thus, not only electric field components radiated to the given direction in the plane that includes a wiring to be measured, but also electric field components of all directions (an electric field noise from wirings adjacent to the wiring to be measured is included as well) may be detected. Therefore, locating a source of a noise in detail is difficult.

Examples of the Second Embodiment

A First Example of the Second Embodiment

A first example of the second embodiment describes a configuration of an electric field detection probe and the manufacturing method.

FIGS. 17A to 17J are schematic sectional views depicting a manufacturing method of the electric field detection probe according to the first example of the second embodiment in order of the processes. FIGS. 18A and 18B are schematic plan views that correspond to FIGS. 17B and 17C, and a cross section along the dotted lines I-I' correspond to FIGS. 17B and 17C.

Figure 17A:
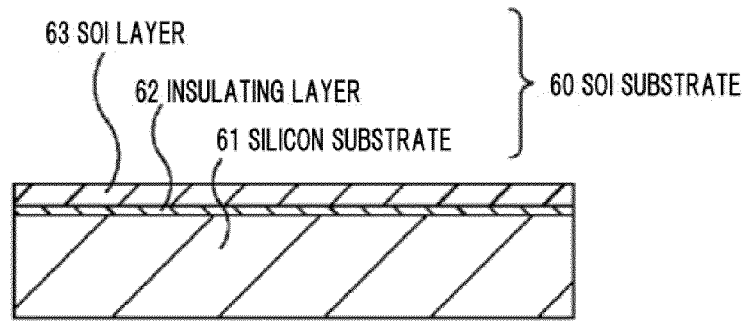
FIGS. 17A to 17J are schematic sectional views depicting a manufacturing method of the electric field detection probe according to a first example of the second embodiment in order of the processes.
Figure 17B:
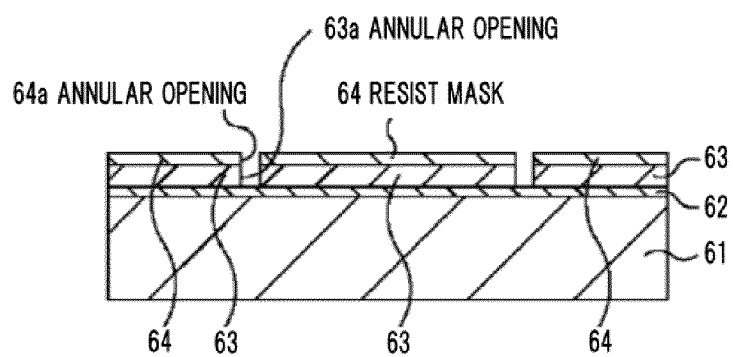
Figure 18A:
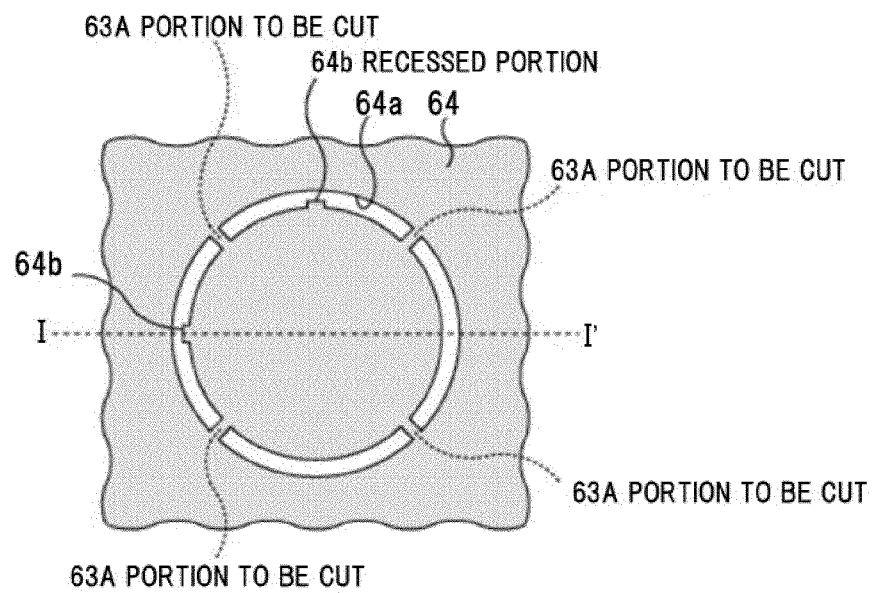
FIGS. 18A and 18B are schematic plan views that correspond to FIGS. 17B and 17C.
Figure 18B:
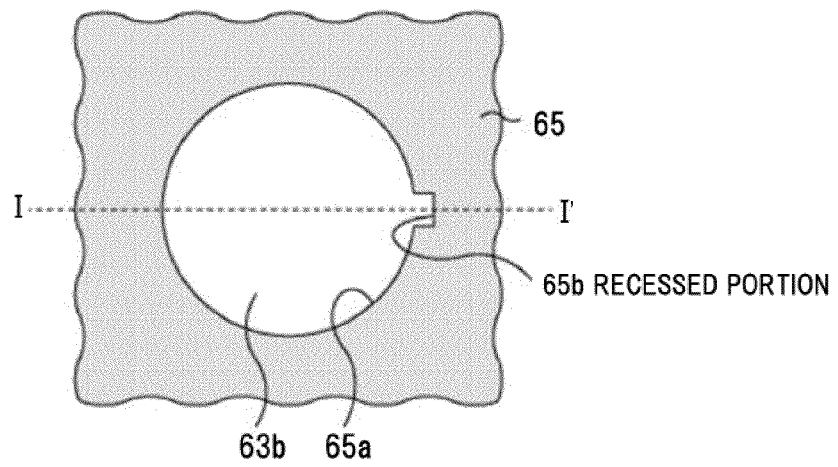

As illustrated in FIGS. 17B and 18A, an SOI layer 63 of an SOI (Silicon (Semiconductor) On Insulator) substrate 60 in FIG. 17A is processed.

For example, an SOI (Silicon (Semiconductor) On Insulator) substrate 60 is prepared to which an SOI layer 63 is provided over a silicon substrate 61 through an insulating layer 62. A resist is applied over the SOI layer 63 of the SOI substrate 60, and the resist is processed by lithography to form a plurality of resist masks 64 with an annular opening 64a that includes recessed portions 64b at two parts of the periphery. The SOI layer 63 is dry-etched using the resist mask 64. An annular-shaped opening 63a is formed over the SOI layer 63 along the annular opening 64a of the resist mask 64 and the SOI layer 63 is processed by cutting to produce a plurality of disks, for example, by leaving a plurality of portions to be cut 63A. In the processed SOI layer 63, projections that correspond to direction indication display units 8a and 8b of the electric field diaphragm 7 are formed at the periphery of the SOI layer 63. The resist mask 64 may be removed, for example, by ashing.

Figure 17C:
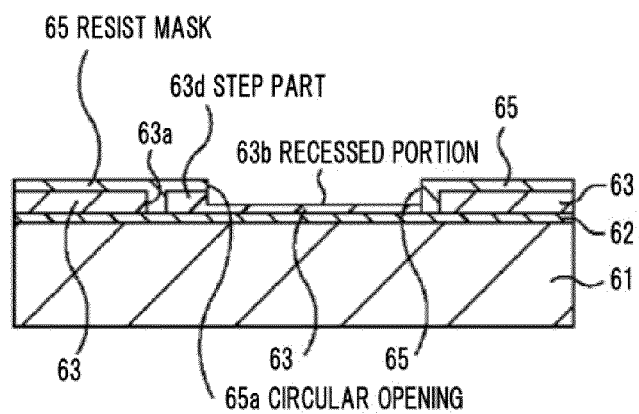

As illustrated in FIGS. 17C and 18B, a recessed portion 63b is formed over the disk-shaped SOI layer 63.

For example, a resist is applied over the SOI layer 63 so as to bury the annular opening 63a. The resist is processed by lithography to form a circular opening 65a that includes a recessed portion 65b at the periphery of the circular opening 65a corresponding to the opening 7a of the electric field diaphragm 7 illustrated in FIG. 14. Accordingly, a resist mask 65 is formed.

A surface layer of the SOI layer 63 that is processed into a circular shape is dry-etched using the resist mask 65. A recessed portion 63b is formed over the SOI layer 63 along the circular opening 65a of the resist mask 65. The recessed portion 63b may be a circular shape to which a convex part that corresponds to the opening 7a of the electric field diaphragm 7 is added. As a result of the formation of the recessed portion 63b, an annular convex step part 63d is formed at a periphery of the circular processed SOI layer 63. The step part 63d is locally cut to form an opening that corresponds to the opening 7a of the electric field diaphragm 7. The resist mask 65 is removed, for example, by ashing.

Figure 17D:
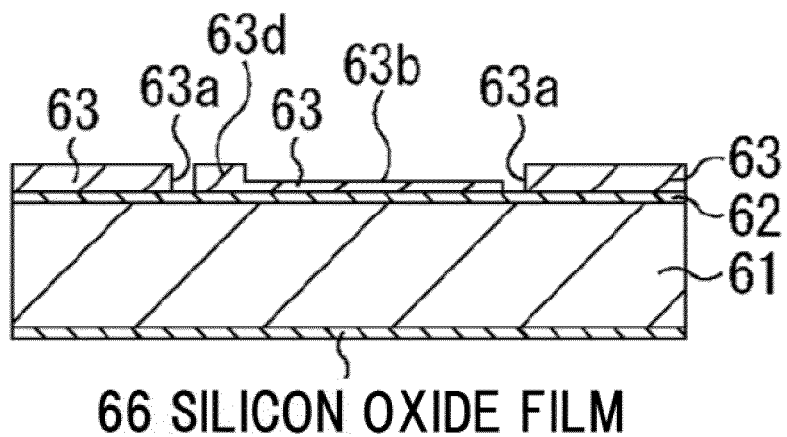

As illustrated in FIG. 17D, a silicon oxide film 66 is formed.

For example, a back surface of the SOI substrate 60, in other words, a back surface of the silicon substrate 61 is thermally-oxidized. A thin silicon oxide film 66 is formed over the back surface of the silicon substrate 21. An insulating film such as a silicon oxide film or a silicon nitride film with a given film thickness may be formed over the back surface of the silicon substrate 61, for example, by a Chemical Vapor Deposition (CVD) method instead of forming the silicon oxide film 66 by thermal oxidation.

Figure 17E:
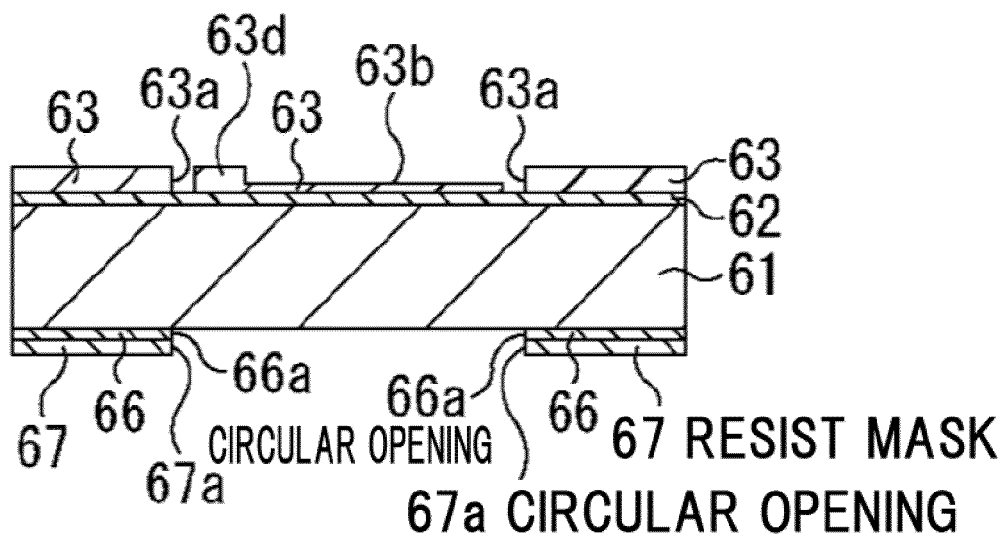

As illustrated in FIG. 17E, the silicon oxide film 66 over the back surface of the silicon substrate 61 is processed.

For example, a resist is applied over the silicon oxide film 66 that is disposed over the back surface of the silicon substrate 61. The resist is processed by lithography to form a resist mask 67 that includes a circular opening 67a, for example, with approximately the same diameter as that of a coaxial cable, which will be described later.

The silicon oxide film 66 that is disposed over a back surface of the silicon substrate 61 is wet-etched using the resist mask 67, for example, by buffered hydrogen fluoride (BHF) solution. An circular opening 66a is formed along the circular opening 67a of the resist mask 67 is formed over the silicon oxide film 66.

Figure 17F:
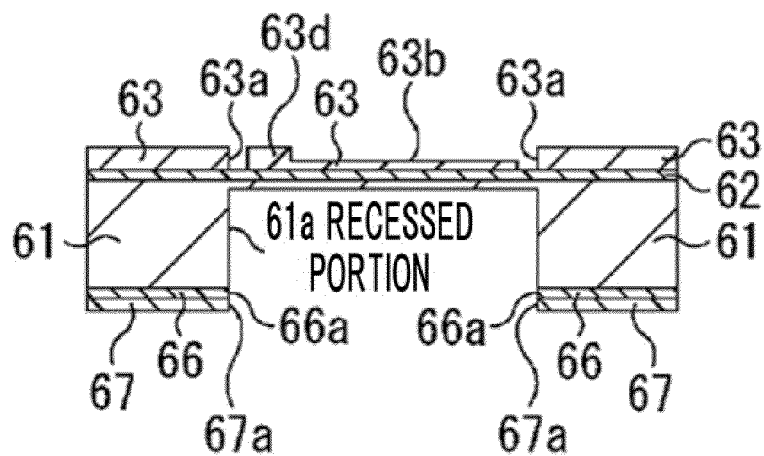

As illustrated in FIG. 17F, a recessed portion 61a is formed over the back surface of the silicon substrate 61.

For example, the back surface of the silicon substrate 61 is dry-etched so as not to expose the insulating layer 62 using the silicon oxide film 66 and the resist mask 67 as masks. The dry-etching is stopped immediately before reaching to the insulating layer 62. The recessed portion 61a is formed at the back surface of the silicon substrate 61 along the circular opening 66a of the silicon oxide film 66.

Figure 17G:
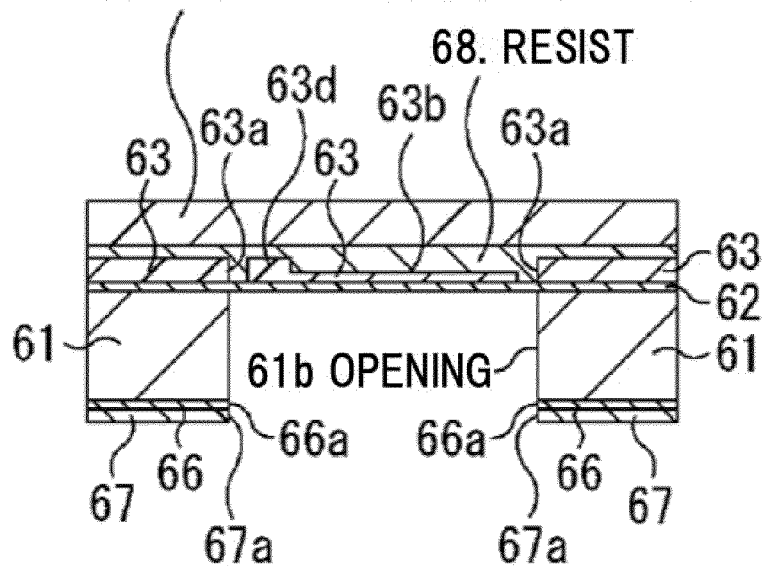

As illustrated in FIG. 17G, an opening 61b is formed by etching a bottom of the recessed portion 61a.

For example, a resist 68 is applied over the SOI layer 63 so as to bury the annular opening 63a in order to etch the insulating layer 62 reliably and precisely, and a substrate support layer 69 that is made up of a silicon substrate is attached over the SOI layer 63 through a resist 68.

A bottom surface of the recessed portion 61a of the silicon substrate 61 is dry-etched until a surface of the insulating layer 62 is exposed. An opening 61b is formed along the circular opening 66a of the silicon oxide film 66.

Figure 17H:
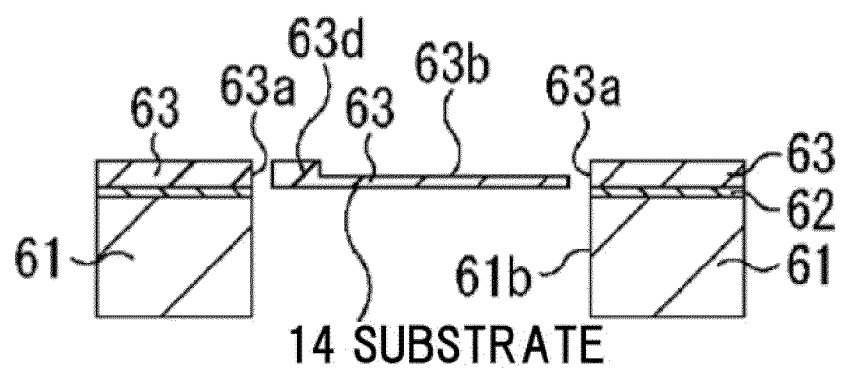

As illustrated in FIG. 17H, the insulating layer 62 that is exposed at a bottom surface of the opening 61b is etched.

For example, the insulating layer 62 that is exposed at the bottom surface of the opening 61b is removed by wet etching, for example, by using buffered hydrogen fluoride (BHF) solution. The insulting layer 62 exposed at the bottom surface of the opening 61b is reliably and precisely removed by etching because the SOI substrate 60 is supported by the substrate support layer 69 illustrated in FIG. 17G. At this time, the silicon oxide film 66 and the resist mask 67 are removed together with the insulting layer 62 at the bottom surface of the opening 61b.

The resist 68 and the substrate support layer 69 are removed, for example, by wet etching.

Figure 17I:
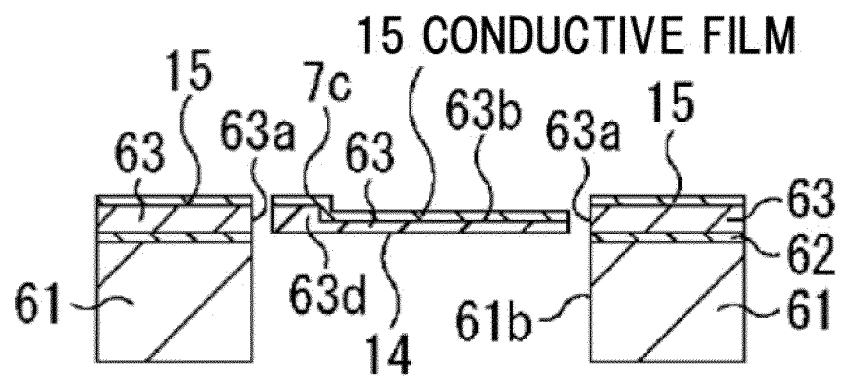

As illustrated in FIG. 17I, a conductive film 15 is formed over the surface of the SOI layer 63.

For example, titan (Ti) with a film thickness of approximately 20 nm is formed by sputtering, and gold (Au) or copper (Cu) with a film thickness of about 300 nm is formed, for example, by vacuum deposition method. A conductive film 15 is formed over the whole surface of the SOI layer 63 that includes a portion of the SOI layer 63 processed to form a disk shape by leaving a given portion. Material for forming the conductive film 15 is not limited to the above but aluminum (Al) may be used, for example. The film formation method is not limited to the vacuum deposition method but other methods such as sputtering and plating may be used.

Figure 17J:
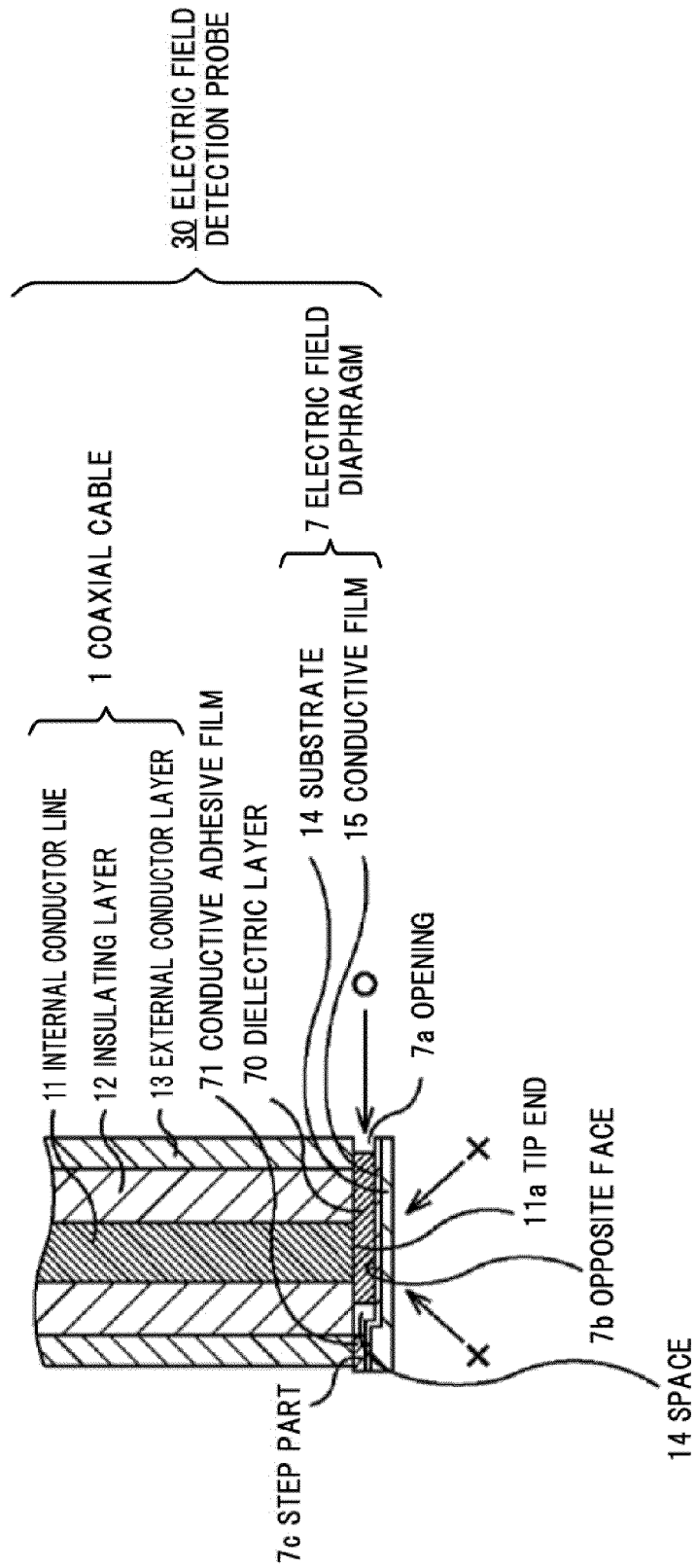

As illustrated in FIG. 17J, the electric field detection probe 30 is formed.

For example, the portions to be cut 63A described in FIG. 18B are cut and the electric field diaphragm 7 in which the conductive film 15 is formed over a surface of a substrate 14 that is made up of the SOI layer 63 is taken out from the SOI substrate 60. A dielectric layer 70 is disposed over the conductive film 15 of the recessed portion 63b of the electric field diaphragm 7. A dielectric material such as polyimide or Teflon (registered trademark of DuPont) is used as the dielectric layer 70. A tip end surface 1a of the coaxial cable 1 that is substantially the same as the coaxial cable illustrated in FIG. 14A is disposed to face the recessed portion 63b of the electric field diaphragm 7 through the dielectric layer 70 and the conductive film 15 at the step part 7c of the electric field diaphragm 7 and the external conductor layer 13 are fixed, for example, with a conductive adhesive film 71. The conductive adhesive film 71 fixes the coaxial cable 1 in the step part 7c of the diaphragm 7 and electrically couples the external conductor layer 13 of the coaxial cable 1 and the conductive film 15.

As described above, the electric field detection probe 30 with the coaxial cable 1 and the electric field diaphragm 7 are formed.

Hereunder, an electric field detection method using the above-configured electric field detection probe 30 will be described.

Figure 19:
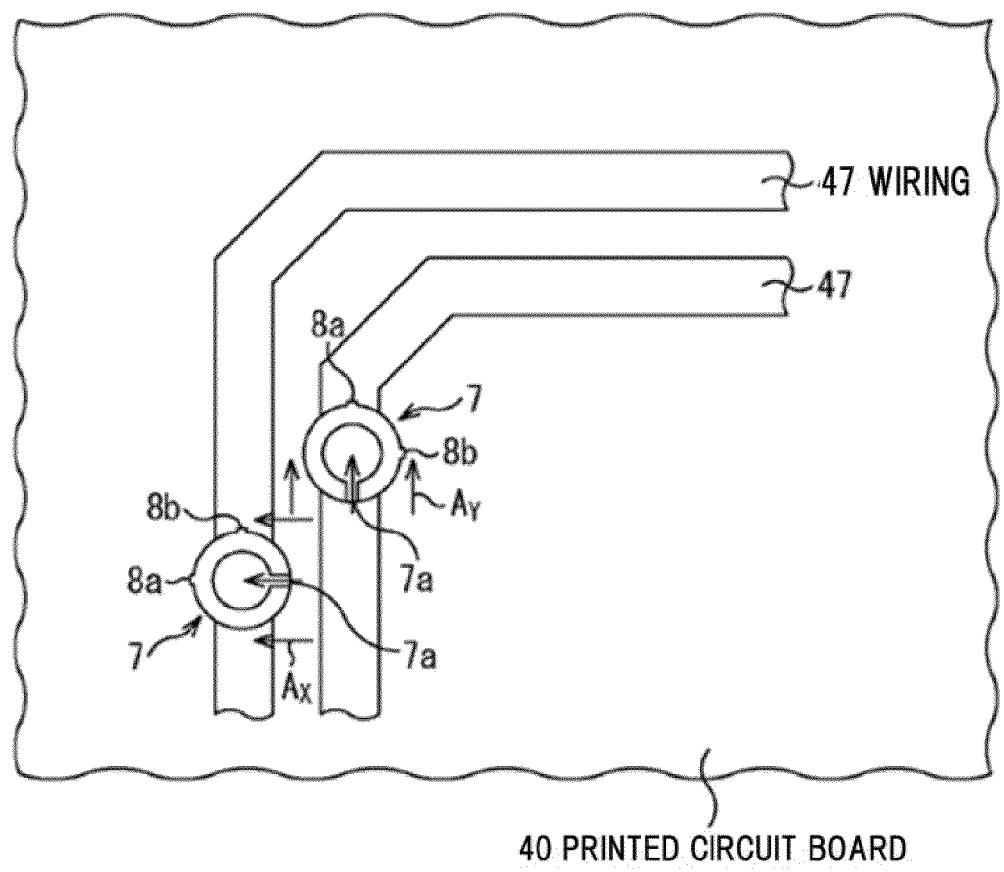
FIG. 19 is a schematic view depicting a method for detecting an electric field using the electric field detection probe according to the first example of the second embodiment.

FIG. 19 is a schematic view depicting a method for detecting an electric field using the electric field detection probe. In FIG. 19, for the convenience of illustration, only an electric field diaphragm 7 is illustrated as the electric field detection probe 30.

The second embodiment uses, as in the first embodiment, for example, the electric field detection system illustrated in FIG. 3.

As a part of a method to manufacture a printed circuit board 40, an electric field detection test is conducted for the printed circuit board 40.

For example, a wiring 47 is formed appropriately by patterning over the printed circuit board 40 using lithography, for example, based on a wiring diagram (wiring data). An electric field radiated from the wiring 47 formed over the printed circuit board 40 is detected using the electric field detection system.

The observation device 45 observes the wiring 47 to be detected over the printed circuit board 40. An image signal generated by the observation device 45 is transmitted to a control device 46 and appropriately displayed on a display unit of the control device 46. The stage controller 43 drives the probe moving mechanism 42 based on a stage control signal from the control device 46. Accordingly, the electric field detection probe 30 mounted on the probe stage 41 scans the wiring 47 to be detected under a non-contact state by maintaining a given distance from the wiring 47.

According to the second embodiment, among electric fields radiated from the wiring 47, mostly an electric field radiated to a given direction in the plane that includes the wiring 47 is selectively detected.

When detecting an electric field radiated to a direction vertical to the longitudinal direction of the wiring 47 (indicated by the arrow Ax in FIG. 17J) in the plane of the printed circuit board 40, the direction indication display unit 8b is directed to a center part of the wiring 47 along the longitudinal direction of the wiring 47, and the electric field detection probe 30 scans along a direction indicated by the direction indication display unit 8a.

Providing the electric field diaphragm 7 to the electric field detection probe 30 allows to detect, among electric fields radiated from the wiring 47, electric fields components radiated vertically to the longitudinal direction of the wiring 47 (X direction) in the plane of the printed circuit board 40 as much as possible.

When detecting an electric field radiated to a direction parallel to the longitudinal direction of the wiring 47 (indicated by an arrow Ay in FIG. 17J) in the plane of the printed circuit board 40, the direction indication display unit 8a is directed to a center part of the wiring 47 along the longitudinal direction of the wiring 47, and the electric field detection probe 30 is scanned along a direction indicated by the direction indication display unit 8a.

Providing the electric field diaphragm 7 to the electric field detection probe 30 allows to detect, among electric fields radiated from the wiring 47, electric fields components radiated to a direction parallel to the longitudinal direction of the wiring 47 (Y direction) in the plane of the printed circuit board 40 as much as possible.

A measurement signal generated based on the distribution of the electric field detected by the electric field detection probe 30 is transmitted to a measurement instrument 44 illustrated in FIG. 3. The measurement instrument 44 may perform spectrum analysis of the detected electric field distribution based on the measurement signal according to the instruction from the control device 46.

As described above, according to the first example of the second embodiment, among electric fields radiated from the wiring 47 over the printed circuit board 40, electric fields radiated to a given direction that corresponds to a position where the opening of the electric field diaphragm is formed, in other words, electric fields radiated to a given direction in the plane that includes wiring 47 may be detected with a relatively simple configuration and high resolution and a source of a noise may be located easily, reliably, and highly accurately.

A Second Example of the Second Embodiment

In a second example, a configuration of an electric field detection probe and the manufacturing method will be described as in the first example; however the method to manufacture the electric field detection probe is different from that of the first example.

FIGS. 20A to 20F are schematic sectional views depicting a manufacturing method of the electric field detection probe according to the second example of the second embodiment in order of the processes. FIGS. 21A to 21B are schematic plan views that corresponds to FIGS. 20A and 20B respectively and cross-sections along the dotted lines I-I'corresponds to FIGS. 20A and 20B respectively.

Figure 20A:
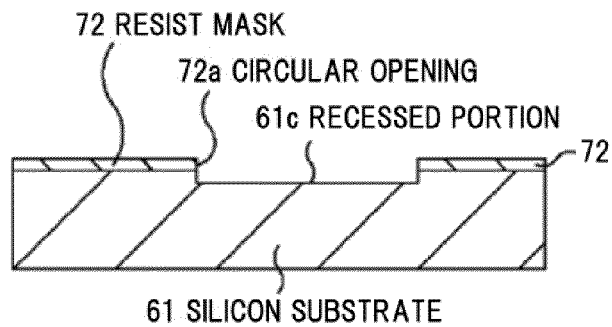
FIGS. 20A to 20F are schematic sectional views depicting a manufacturing method of the electric field detection probe according to the second example of the second embodiment in order of the processes.
Figure 21A:
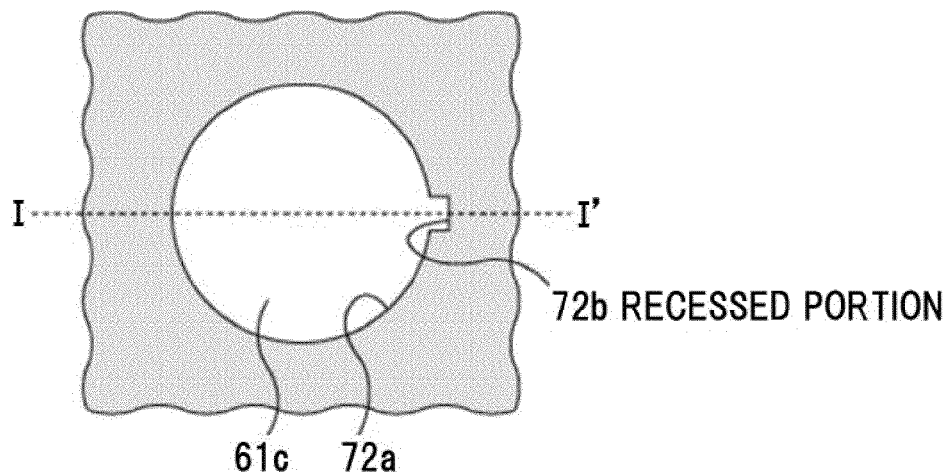
FIGS. 21A to 21B are schematic plan views that corresponds to FIGS. 20A and 20B respectively.
Figure 21B:
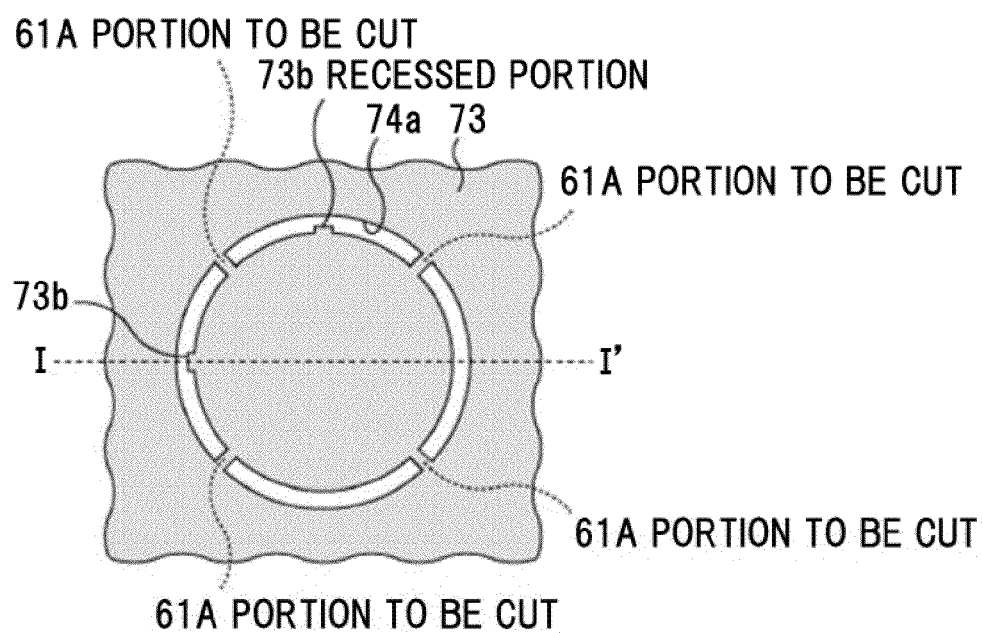

As illustrated in FIGS. 20A and 21A, a recessed portion 61c is formed over a surface layer of a silicon substrate 61.

For example, a resist is applied over the silicon substrate 61 and the resist is processed by lithography to form a circular opening 72a that includes a recessed portion 72b at the periphery of the circular opening 72a corresponding to the opening 7a of the electric field diaphragm 7 illustrated in FIG. 14. Accordingly, a resist mask 72 is formed.

A surface layer of a silicon substrate 61 is dry-etched using a resist mask 65. A circular recessed portion 61c is formed over the surface of the silicon substrate 61 along the circular opening 72a of the resist mask 72. The recessed portion 61c may be a circular shape to which a convex part that corresponds to the opening 7a of the electric field diaphragm 7 is added.

Figure 20B:
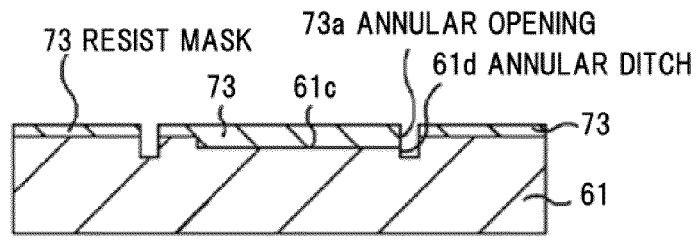

As illustrated in FIGS. 20B and 21B, a resist is applied over the silicon substrate 61 and the resist is processed by lithography to form a plurality of resist masks 73 that include an annular opening 73a with recessed portions, for example, at two parts of the periphery of the annular opening 73a. The silicon substrate 61 is dry-etched using the resist mask 73. An annular ditch 61d is formed over the surface of the silicon substrate 61 along the annular opening 73a of the resist mask 73. The annular ditch 61d is not formed at a given part along the annular shape and the given portion is assumed to be a portion to be cut 61A. In the circular processed silicon substrate 61, projections that correspond to the direction indication display units 8a and 8b of the electric field diaphragm 7 illustrated in FIG. 14 are formed at the periphery of the silicon substrate 61. The resist mask 74 is removed, for example by ashing.

Figure 20C:
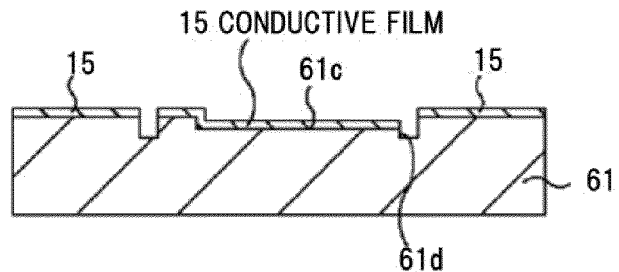

As illustrated in FIG. 20C, a conductive film 15 is formed over the surface of the silicon substrate 61.

For example, titan (Ti) with a film thickness of approximately 20 nm is formed by sputtering, and gold (Au) or copper (Cu) with a film thickness of about 300 nm is formed, for example, by vacuum deposition method. A conductive film 15 is formed over the whole surface of the silicon substrate 61 except for the annular ditch 61d. Material for forming the conductive film 15 is not limited to the above but, for example, aluminum (Al) may be used. The film formation method is not limited to the vacuum deposition method but other methods such as sputtering and plating may be used.

Figure 20D:
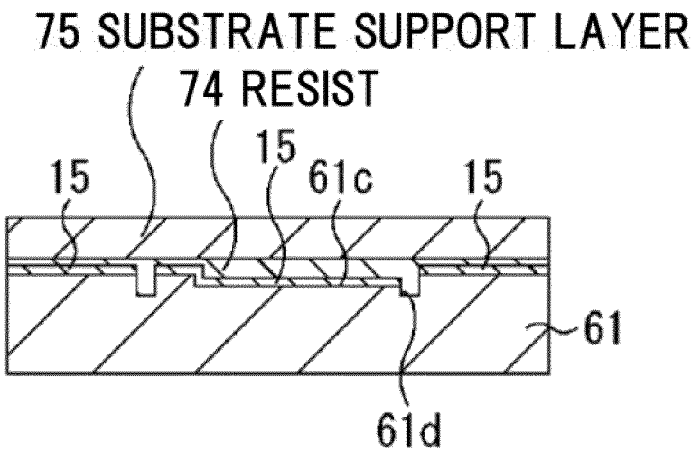

As illustrated in FIG. 20D, a substrate support layer 75 is formed to reliably and accurately polish a back surface of a silicon substrate 61, which will be described later.

For example, a resist 74 is applied over the silicon substrate 61 so as to bury the annular ditch 61d, and a substrate support layer 75 that is made up of a silicon substrate is attached over the silicon substrate 61 through the resist 74.

Figure 20E:
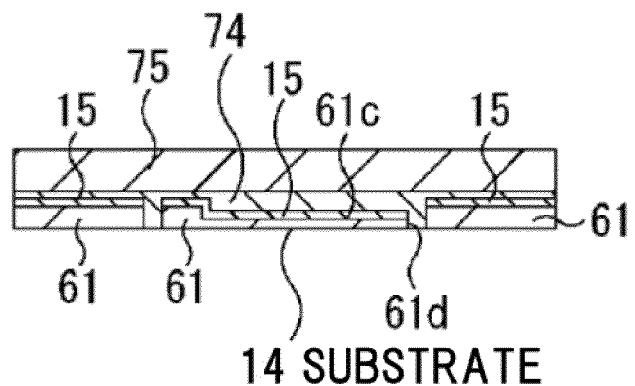

The back surface of the silicon substrate 61 is polished as illustrated in FIG. 20E.

For example, the back surface of the silicon substrate 61 is polished, for example, by chemical mechanical polishing (CMP) until reaching to the annular ditch 61d.

Figure 20F:
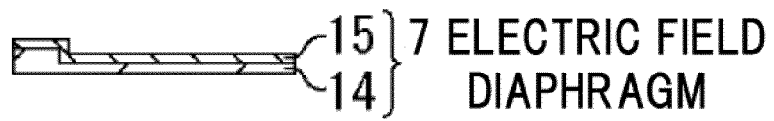

As illustrated in FIG. 20F, the electric field diaphragm 7 is formed.

For example, the resist 74 and the substrate support layer 75 are removed, for example, by wet etching.

The portions to be cut 61A described in FIG. 20B where the annular ditch 61d of the silicon substrate 61 is not formed is cut, and the electric field diaphragm 7 in which the conductive film 15 is formed over the surface of the substrate 14 that is made up of the silicon substrate 61 is taken out from the silicon substrate 61.

A dielectric layer 70 is disposed over the conductive film 15 of the recessed portion 61c of the electric field diaphragm 7 as in FIG. 17J according to the first example. A dielectric material such as polyimide or Teflon (registered trademark of DuPont) is used as the dielectric layer 70. A tip end surface 1a of the coaxial cable 1 that is substantially the same as the coaxial cable illustrated in FIG. 18A is disposed to face the recessed portion 61c of the electric field diaphragm 7 through the dielectric layer 70 and the conductive film 15 at the step part 7c of the electric field diaphragm 7 and the external conductor layer 13 are fixed, for example, with a conductive adhesive film 71. The conductive adhesive film 71 fixes the coaxial cable 1 in the step part 7c of the diaphragm 7 and electrically couples the external conductor layer 13 of the coaxial cable 1 and the conductive film 15.

As described above, the electric field detection probe 30 with the coaxial cable 1 and the electric field diaphragm 7 are formed.

As described above, according to the second example as in the first embodiment, among electric fields radiated from the wiring 47 over the printed circuit board 40, mostly electric fields radiated to a given direction that corresponds to a position where the opening of the electric field diaphragm is formed, in other words, electric fields radiated to a given direction in the plane that includes the wiring 47 may be detected with a relatively simple configuration and high resolution and a source of a noise may be located easily, reliably, and highly accurately.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. An electric field detection probe, comprising:
   a cable including,
   an internal conductor line;
   an insulating layer that coats a surface of the internal conductor line and exposes a tip end of the internal conductor line;
   an external conductor layer that coats a surface of the insulating layer and exposes the tip end; and
   an electric field diaphragm,
   wherein the electric field diaphragm is electrically coupled to the external conductor layer, covers the tip end surface of the cable except for an opening,
   wherein the electric field diaphragm includes the opening that is formed in a position to face the tip end of the internal conductor line, and the diameter of the opening is smaller than the diameter of the internal conductor line.

2. The electric field detection probe according to claim 1, wherein the electric field diaphragm covers a part of the side surface of the external conductor line.

3. The electric field detection probe according to claim 1, wherein the opening is formed at a side of the electric field diaphragm.

4. The electric field detection probe according to claim 3, further comprising: at least one direction indication display unit in a position different from the position of the opening at the side of the electric field diaphragm.

5. The electric field detection probe according to claim 1, wherein the tip end of the internal conductor line and a plane of the electric field diaphragm facing the internal conductor line are spaced apart.

6. The electric field detection probe according to claim 1, further comprising: a dielectric layer disposed between the tip end of the internal conductor line and the plane of the electric field diaphragm facing the internal conductor line.

7. The electric field detection probe according to claim 2, wherein a distance between the tip end of the internal conductor line and the plane of the electric field diaphragm facing the internal conductor line is made variable.

8. The electric field detection probe according to claim 2, wherein the opening of the electric field diaphragm is formed so as to be smaller than a cross-section of the internal conductor line.

9. The electric field detection probe according to claim 2, wherein a size of the opening of the electric diaphragm is made variable.

10. The electric field detection probe according to claim 2, wherein the opening of the electric field diaphragm is formed to have a slit shape.

11. The electric field detection probe according to claim 2, the electric field diaphragm is a flat shape that is disposed to face the tip end of the internal conductor line.

12. A method for detecting an electric field, comprising:
moving an opening of an electric field detection probe closer to a wiring to be detected; and
detecting an electric field near the wiring by the electric filed detection probe;
whereby, the electric field detection probe includes,
a cable that includes, an internal conductor line;
an insulating layer that coats a surface of the internal conductor line and exposes a tip end of the internal conductor line;
an external conductor layer that coats a surface of the insulating layer and exposes the tip end; and
an electric field diaphragm,
wherein the electric field diaphragm is electrically coupled to the external conductor layer and covers the tip end surface of the cable except for the opening,
wherein the electric field diaphragm includes the opening that is formed in a position to face the tip end of the internal conductor line, and the diameter of the opening is smaller than the diameter of the internal conductor line.

13. The method for detecting an electric field according to claim 12, wherein the electric field diaphragm covers a part of the side surface of the external conductor line.

14. The method for detecting an electric field according to claim 12, wherein the opening is formed at a side of the electric field diaphragm.

15. The method for detecting an electric field according to claim 14, wherein the electric field diaphragm further comprising: at least one direction indication display unit in a position different from a position of the opening at the side of the electric field diaphragm.

16. The method for detecting an electric field according to claim 13, wherein: the opening of the electric field diaphragm is formed to have a slit shape, with a longitudinal direction of the opening of the electric field diaphragm aligned with an extending direction of the wiring; and detecting the electric field near the wiring includes the electric field detection probe scanning to a direction that crosses the extending direction of the wiring.

17. A method for manufacturing a circuit board, comprising:
forming a wiring over a substrate to form a circuit board;
detecting an electric field near the wiring using an electric field detection probe by positioning an opening of the electric field detection probe closer to the wiring to be detected; and
evaluating the circuit board based on the electric field;
whereby the electric field detection probe includes:
a cable that further includes, an internal conductor line;
an insulating layer that coats a surface of the internal conductor line and exposes a tip end of the internal conductor line;
an external conductor layer that coats a surface of the insulating layer and exposes the tip end; and
an electric field diaphragm, wherein the electric field diaphragm is electrically coupled to the external conductor layer, and covers the tip end surface of the cable except for the opening,
wherein the electric field diaphragm includes the opening that is formed in a position to face the tip end of the internal conductor line, and the diameter of the opening is smaller than the diameter of the internal conductor line.

18. The method for manufacturing a circuit board according to claim 17, wherein the electric field diaphragm covers a part of the side surface of the external conductor line.

19. The method for manufacturing a circuit board according to claim 17, wherein the opening is formed at a side of the electric field diaphragm.

20. The method for manufacturing a circuit board according to claim 18, wherein: the opening of the electric field diaphragm is formed to be a slit shape, with a longitudinal direction of the opening of the electric field diaphragm aligned with an extending direction of the wiring; and detecting the electric field near the wiring includes the electric field detection probe scanning to a direction that crosses the extending direction of the wiring.

* * * * *